United States Patent
Minami et al.

(10) Patent No.: US 6,986,214 B2
(45) Date of Patent: Jan. 17, 2006

(54) LOW-PRESSURE DRYER AND LOW-PRESSURE DRYING METHOD

(75) Inventors: Tomohide Minami, Kikuyo-Machi (JP); Hiroshi Shinya, Koshi-Machi (JP); Takahiro Kitano, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 53 days.

(21) Appl. No.: 10/859,088

(22) Filed: Jun. 3, 2004

(65) Prior Publication Data

US 2004/0216325 A1 Nov. 4, 2004

Related U.S. Application Data

(62) Division of application No. 10/384,571, filed on Mar. 11, 2003, now Pat. No. 6,796,054.

(30) Foreign Application Priority Data

Mar. 12, 2002 (JP) ........................................ 2002-067312
Mar. 12, 2002 (JP) ........................................ 2002-067313

(51) Int. Cl.
*F26B 3/00* (2006.01)

(52) U.S. Cl. .............................. 34/443; 34/107; 34/201; 134/902; 134/200; 134/140; 134/182

(58) Field of Classification Search ................... 34/443, 34/201, 107, 58; 134/902, 157, 200, 140, 134/182, 183, 25.4, 137
See application file for complete search history.

(56) References Cited

U.S. PATENT DOCUMENTS

| | | | |
|---|---|---|---|
| 5,581,905 A | 12/1996 | Huelsman et al. | |
| 6,190,459 B1 | 2/2001 | Takeshita et al. | |
| 6,222,161 B1 | 4/2001 | Shirakawa et al. | |
| 6,273,104 B1 | 8/2001 | Shinbara et al. | |
| 6,431,190 B1 | 8/2002 | Oka et al. | |
| 6,588,437 B1 | 7/2003 | Higashi | |

*Primary Examiner*—Henry Bennett
*Assistant Examiner*—Camtu Nguyen
(74) *Attorney, Agent, or Firm*—Oblon, Spivak, McClelland, Maier & Neustadt, P.C.

(57) ABSTRACT

A low-pressure dryer dries a substrate applied a coating solution thereon at low pressure. The dryer includes an airtight chamber installing a substrate table to place the substrate thereon; a diffuser plate, provided as facing the substrate placed on the substrate table with a gap, for discharging gas existing in the gap toward outside, the diffuser plate having a size almost the same as or larger than the substrate; a substrate-temperature adjuster, installed in the substrate table, for adjusting a temperature of the substrate; and a decompression mechanism for decompressing the airtight chamber. The diffuser plate has a temperature adjuster for making temperature adjustments to have a temperature difference between a first region and a second region of the diffuser plate, the first region facing a center region of the substrate, the second region being outside the first region and including a region facing an outer region of the substrate.

5 Claims, 25 Drawing Sheets

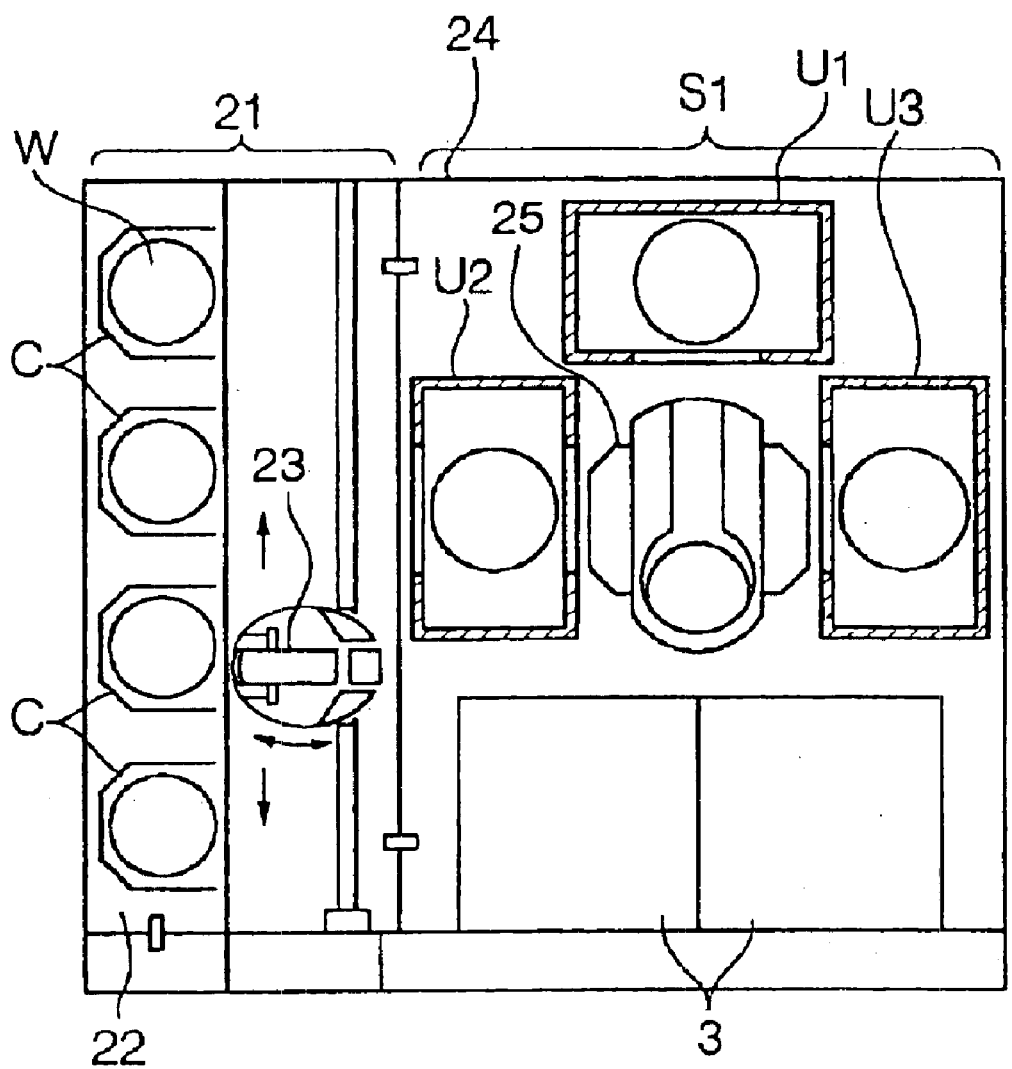
F I G. 6

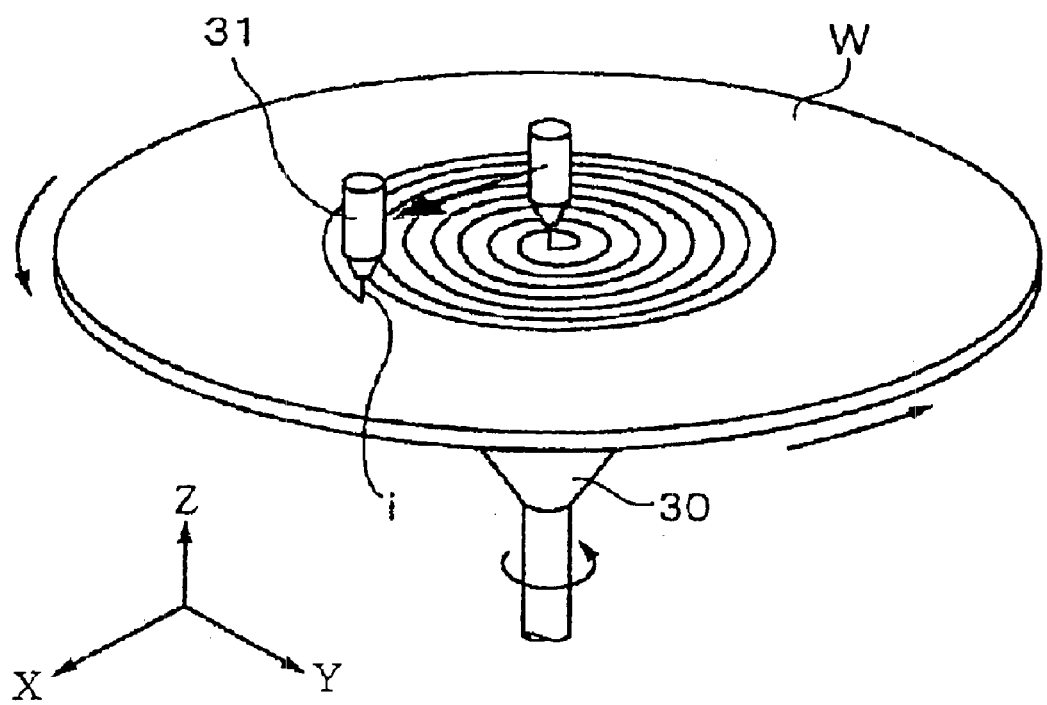
F I G. 7

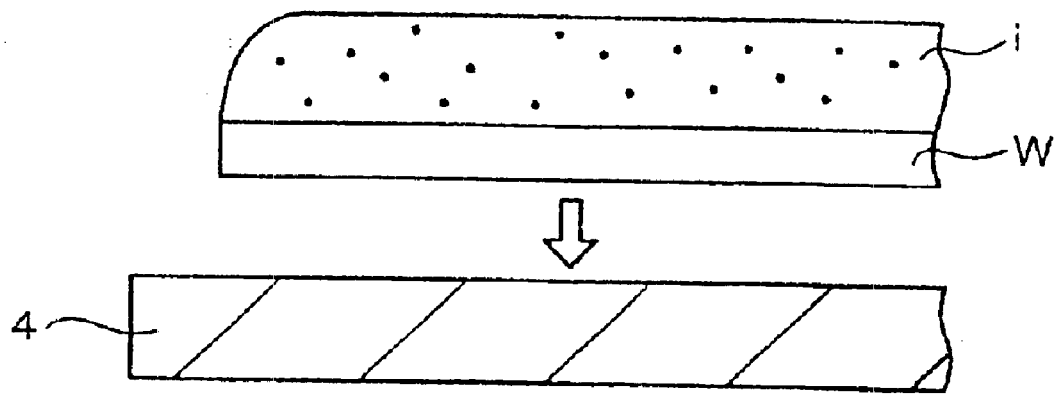
F I G. 26A
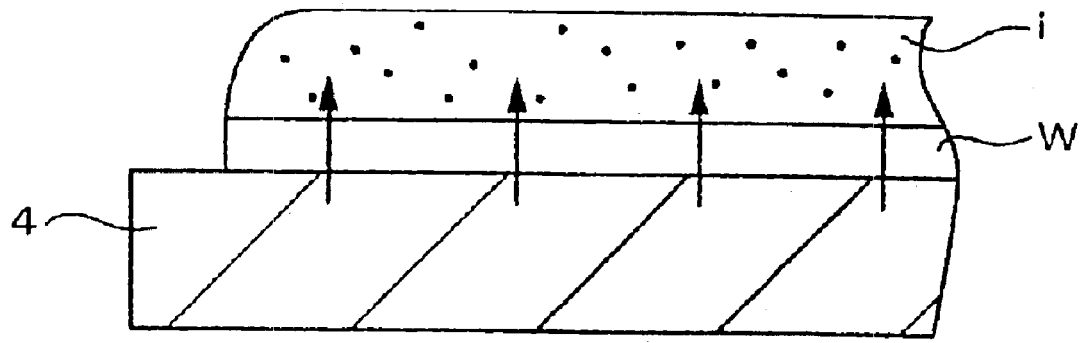
F I G. 26B

LOW-PRESSURE DRYER AND LOW-PRESSURE DRYING METHOD

FIELD OF THE INVENTION

The present invention relates to a low-pressure dryer and a low-pressure drying method for drying a substrate applied a coating solution or resist solution for forming an interlayer insulating film or a device-protection film thereon, at low pressure to dry the solution.

BACKGROUND OF THE INVENTION

One of the processes in manufacture of semiconductors is application of a coating solution on a substrate such as a semiconductor wafer to form a coating film thereon as an interlayer insulating film or a device-protection film.

In detail, a coating solution containing polyimide and solvent is applied on a substrate or wafer, thus a coating film made of polyimide being formed after evaporation of solvent.

It is preferable to dry a coating-solution-applied wafer in a low-pressure dryer to dry the wafer for a short period. This is because a low volatile solvent such as thinner having a high boiling point is mostly used as the solvent contained in a coating solution.

Shown in FIG. 1 is a known low-pressure dryer equipped with an airtight chamber 1 with a cover 11 and a table 12. Provided on top of the cover 11 is an exhaust opening 13 connected to a vacuum pump 15 thorough an exhaust passage such as a pipe 14, for decompressing the chamber 1. Further provided in the chamber 1 is an elevatable diffuser plate 16 for forming a uniform exhaust stream over a wafer W. The exhaust stream is composed of evaporating components of a coating solution applied on the wafer W.

In the known low-pressure dryer, a coating-solution-applied wafer W is placed on the table 12. The diffuser plate 16 is then adjusted for its height so as to face the wafer W.

The wafer W is heated to a specific temperature such as 30° C. by a temperature adjuster (not shown) provided in the table 12. The vacuum pump 15 is then operated to decompress the chamber 1, to promote evaporation (drying) of the solvent in the coating solution, evaporating solvent components forming an exhaust stream spreading outwardly from between the wafer W and the diffuser plate 16. Polyimide components remaining on the wafer W is turned into a coating film thereon.

Discussed below are several drawbacks of such known drying mechanism.

Firstly, a solvent evaporation speed could depend on the difference in density of solvent contained in a coating solution and gaseous solvent near the surface of the coating solution. The larger the density difference, the higher the evaporation speed.

Solvent components evaporating from the coating solution will be formed into a stream flowing outwardly along the wafer surface with the help of the diffuser plate 16 and discharged from the chamber 1.

In detail, the evaporating solvent components will be discharged upright while being attracted in all directions from a center region of, for example, 40 mm in radius from the wafer center. The density of the gaseous solvent will thus be kept relatively low, thus evaporation of the solvent being promoted.

In contrast, the density of the gaseous solvent on the outer region of the wafer W will be high due to combination of the evaporating solvent components from the coating solution on the outer and center regions, thus evaporation of the solvent being delayed.

In summary, as shown in FIG. 2, the evaporation speed on the wafer center region will be high whereas that on the outer region will be low, thus causing variation in evaporation over the wafer surface.

Moreover, the surface temperature of the coating solution will be decreased due to heat of evaporation while the solvent is evaporating from the coating solution. The variation in evaporation speed discussed above will cause temperature difference of about 2 to 4° C. between the coating solution on the wafer center region and the outer region, or the temperature of the coating solution on the wafer center region (evaporation promoted) will be lowered quickly due to heat of evaporation compared to the outer region. The coating solution over the wafer W will thus be attracted to the center region with the help of surface tension. This could result in a thick or swelling coating film formed on the wafer center region, as illustrated in FIG. 3.

Moreover, the film of coating solution formed on the outer region of, for example, 5 mm in width from the wafer edge, will be round as illustrated in FIG. 4A, due to surface tension caused by adherence of the coating solution to the wafer surface and condensation of the coating solution.

Low-pressure drying to the wafer W having such coating solution formed on the outer region in the known Low-pressure dryer shown in FIG. 1 could promote evaporation of solvent from the round section in addition to upward evaporation from the outer region.

In detail, the coating solution on the outer region having the evaporation area larger than the inner region will be evaporated much more than that on the inner region. Evaporation of solvent from a coating solution will cause temperature decrease on the solution surface due to heat of evaporation, thus producing a large surface tension.

The differences in amount of evaporation and surface tension due to the difference in evaporation area between the outer region and the inner region will force the coating solution to be attracted to the outer region. This could result in a thick or swelling coating film formed on the wafer outer region, as illustrated in FIG. 4B, in contrast to that shown in FIG. 3.

SUMMARY OF THE INVENTION

A purpose of the present invention is to provide a low-pressure dryer and a low-pressure drying method for drying a substrate applied a coating solution thereon, to achieve high film-thickness uniformity over the substrate surface by controlling the surface tension of the coating solution uniform over the surface or suppressing the increase in surface tension at the substrate outer region.

The present invention provides a low-pressure dryer for drying a substrate applied a coating solution thereon at low pressure, comprising: an airtight chamber installing a substrate table to place the substrate thereon; a diffuser plate, provided as facing the substrate placed on the substrate table with a gap, for discharging gas existing in the gap toward outside, the diffuser plate having a size almost the same as or larger than the substrate; a substrate-temperature adjuster, installed in the substrate table, for adjusting a temperature of the substrate; and a decompression mechanism for decompressing the airtight chamber, wherein the diffuser plate has a temperature adjuster for making temperature adjustments to have a temperature difference between a first region and a second region of the diffuser plate, the first region facing a center region of the substrate, the second region being outside the first region and including a region facing an outer region of the substrate.

Moreover, the present invention provides a low-pressure dryer for drying a substrate applied a coating solution thereon at low pressure, comprising: an airtight chamber installing a substrate table to place the substrate thereon; a diffuser plate, provided as facing the substrate placed on the substrate table with a gap, for discharging gas existing in the gap to toward outside, the diffuser plate having a size almost the same as or larger than the substrate; a substrate-temperature adjuster, installed in the substrate table, for adjusting a temperature of the substrate; and a decompression mechanism for decompressing the airtight chamber, wherein the diffuser plate has a concavity facing a center region of the substrate.

Furthermore, the present invention provides a low-pressure dryer for drying a substrate applied a coating solution thereon at low pressure, comprising: an airtight chamber installing a substrate table to place the substrate thereon; a ventilation resistive element, provided as facing the substrate placed on the substrate table with a gap, the ventilation resistive element exhibiting permeability at a first region thereof facing an outer region of the substrate lower than permeability at a second region thereof inside the first region; a diffuser plate, provided as facing the ventilation resistive element with a gap, for discharging gas toward outside, the gas containing evaporating components from the coating solution and passing through the ventilation resistive element to outside; a substrate-temperature adjuster, installed in the substrate table, for adjusting a temperature of the substrate; and a decompression mechanism for decompressing the airtight chamber.

Furthermore, the present invention provides a low-pressure drying method of drying a substrate applied a coating solution thereon at low pressure, comprising the steps of: placing the substrate on a substrate table installed in an airtight chamber; positioning a diffuser plate as facing the substrate placed on the substrate table with a gap, the diffuser plate having a size almost the same as or larger than the substrate; adjusting a temperature of the substrate placed on the substrate table to a given temperature; making temperature adjustments to have a temperature difference between a first region and a second region of the diffuser plate, the first region facing a center region of the substrate, the second region being outside the first region and including a region facing an outer region of the substrate; and decompressing the airtight chamber to discharge gas existing in the gap to outside the diffuser plate, thus evaporating solvent components contained in the coating solution.

Moreover, the present invention provides a low-pressure drying method of drying a substrate applied a coating solution thereon at low pressure, comprising the steps of: placing the substrate on a substrate table installed in an airtight chamber; positioning a diffuser plate as facing the substrate placed on the substrate table with a gap so that a concavity of the diffuser plate faces a center region of the substrate, the diffuser plate having a size almost the same as or larger than the substrate; adjusting a temperature of the substrate placed on he substrate table to a given temperature; and decompressing the airtight chamber to discharge gas existing in the gap to outside the diffuser plate, thus evaporating solvent components contained in the coating solution.

Furthermore, the present invention provides a low-pressure drying method of drying a substrate applied a coating solution thereon at low pressure, comprising the steps of: placing the substrate on a substrate table installed in an airtight chamber; positioning a ventilation resistive element, provided as facing the substrate placed on the substrate table with a gap, the ventilation resistive element exhibiting permeability at a first region thereof facing an outer region of the substrate lower than permeability at a second region thereof inside the first region; positioning a diffuser plate over the ventilation resistive element as facing the ventilation resistive element with a gap, in relation to the substrate placed under the ventilation resistive element; and decompressing the airtight chamber to allow evaporating solvent components from the outer region of the substrate to pass through the ventilation resistive element and discharge gas existing between the diffuser plate and the ventilation resistive element to outside the diffuser plate, thus evaporating solvent components contained in the coating solution.

BRIEF DESCRIPTION OF DRAWINGS

FIG. 6 shows a plan view of the coating system installing the low-pressure dryer according to the present invention;

FIG. 7 illustrates a coating technique to form a coating film to be subjected to a low-pressure drying process;

FIGS. 26A and 26B illustrate a further modification to the present invention;

DETAILED DESCRIPTION OF PREFERRED EMBODIMENTS

Preferred embodiments according to the present invention will be disclosed with reference to the attached drawings.

Figure 5:
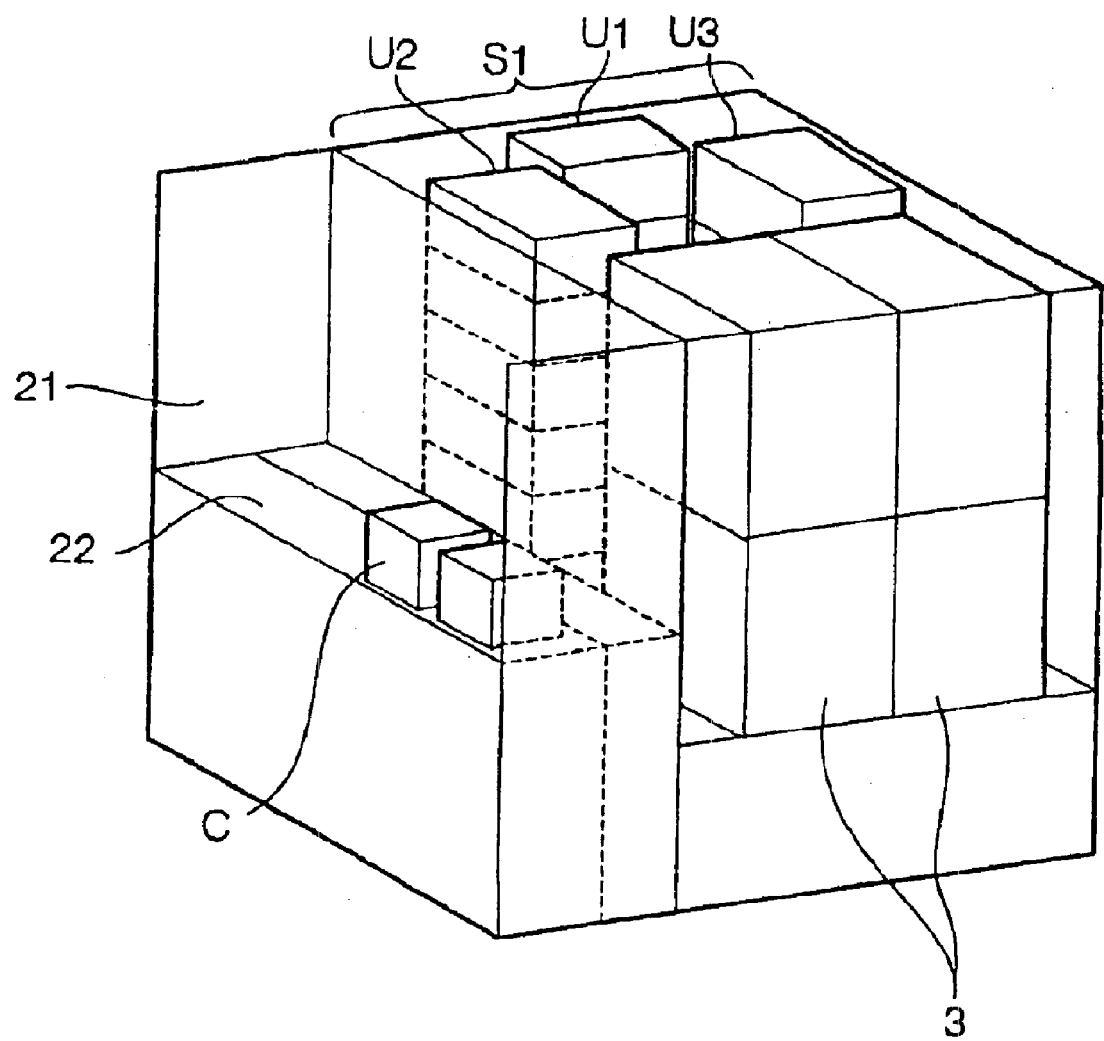
FIG. 5 shows a perspective view of a coating system installing a low-pressure dryer according to the present invention.

Shown in FIGS. 5 and 6 is a coating system in which a low-pressure dryer according to the present invention can be installed.

Provided in a cassette station 21 are a cassette table 22 and a transfer mechanism 23. Placed on the cassette table 22 are several cassettes C containing semiconductor wafers, such as 25 wafers W. The transfer mechanism 23 transfers wafers W between the cassettes C and a processing section S1 surrounded by a housing 24 and provided next to the cassette station 21. Set in the center of the processing section S1 is a main transfer mechanism 25 surrounded by processing units. Provided in the right side when viewed from the cassette station 21 are several coating units 3 whereas in the left, front and rear sides are multi-stage heating/cooling rack units U1, U2 and U3.

The rack units U1, U2 and U3 consist of several processing units for pre- and post-processing to the coating units 3. Processing units installed in each rack unit are, for example, a low-pressure dryer unit for drying each wafer W applied a coating solution by the coating unit 3 at a low pressure to evaporate solvent contained in the coating solution, a heating unit for heating (baking) each wafer W and a cooling unit for cooling each wafer w. The rack unit U3 further installs a transfer unit for receiving and transferring each wafer W.

The main transfer mechanism 25 is elevatable, shiftable in front and rear and rotatable for wafer transfer among the coating units 3 and rack units U1, U2 and U3.

In operation, several cassettes C are set on the cassette table 22. Wafers W are taken out, one by one, from any cassette C by the transfer mechanism 23 and transferred to the main transfer mechanism 25 via the transfer unit in the heating/cooling rack unit U3.

Each wafer W is transferred into a processing unit in the rack unit U3 by the main transfer mechanism 25, for hydrophobic process. The wafer W is then transferred into one of the coating units 3 for application of a coating solution. The coated wafer W is transferred to any one of the rack units U1, U2 and U3 for heating and then cooling to a given temperature. The processed wafer W is returned to one of the cassettes C on the cassette table 22.

Explained below briefly with respect to FIG. 7 is a coating process at the coating units 3 performed just before the low-pressure drying process according to the present invention.

A coating solution "i", composed of polyimide (to become coating film after a drying process) and solvent such as thinner, is applied on a wafer W.

The coating process employs a so-called spiral coating technique. In detail, the wafer W is held on a wafer holder 30 while rotating in a wafer-processing space in the coating unit 3. Then, a dispenser nozzle 31 sprays the coating solution "i" on the wafer W while traversing over the wafer W in wafer-radius direction (direction X) at a given speed. The coating solution "i" is thus coated on the wafer W spirally or in one stroke.

Disclosed next in detail is the low-pressure dryer according to the present invention.

Figure 8:
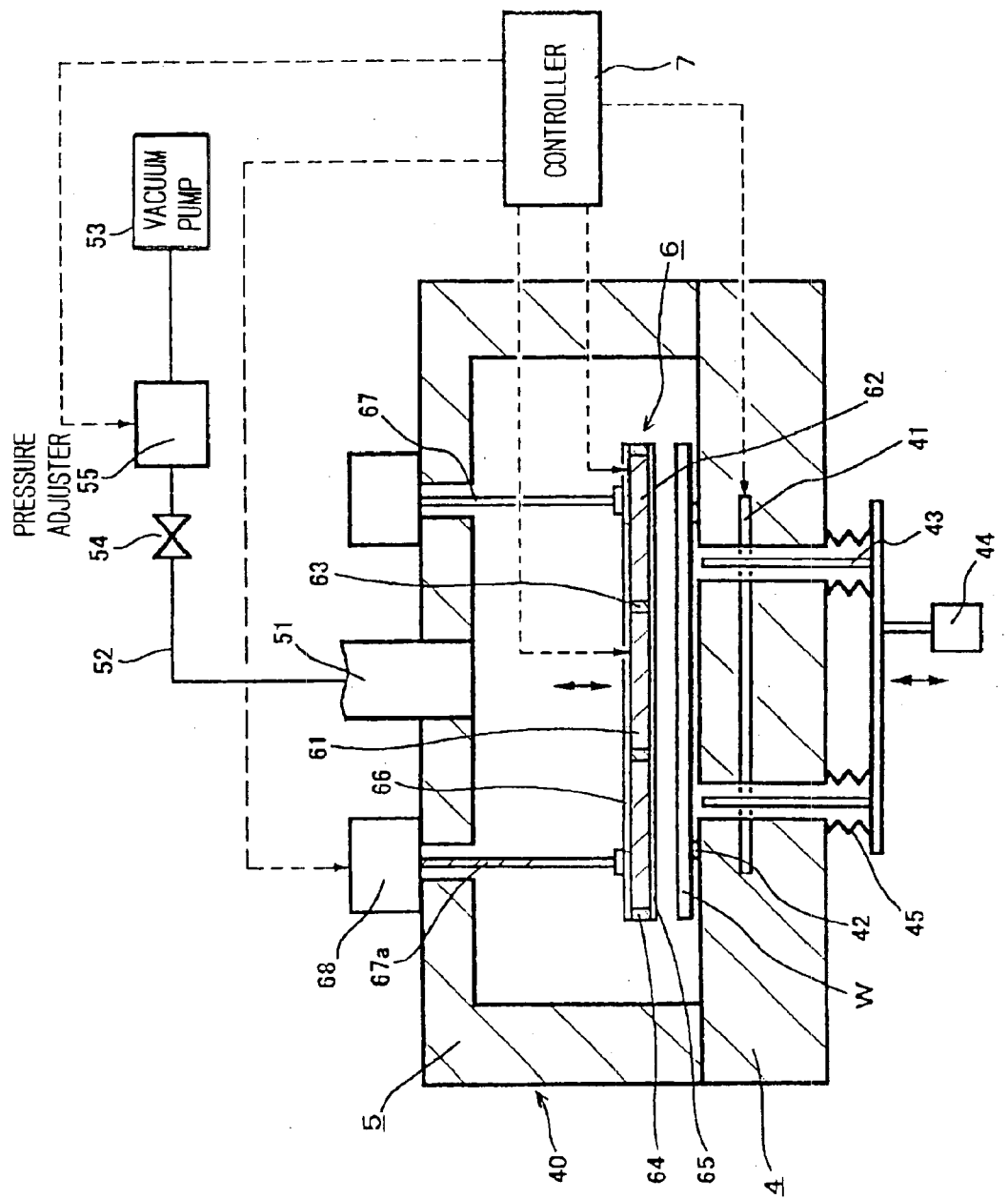
FIG. 8 shows a vertical section of a first embodiment of low-pressure dryer according to the present invention.

A first embodiment of low-pressure dryer shown in FIG. 8 is equipped with a substrate table 4. Placed on the table 4 is, for example, an 8-inch wafer W coated with the coating solution "i".

Embedded in the substrate table 4 is a substrate-temperature adjuster 41 such as a heater having a resistive heating element. The table 4 and the substrate-temperature adjuster 41 constitute a temperature-adjusting plate.

Fixed on the substrate table 4 are substrate-holding protrusions 42 to match the rear edge section of each wafer W so that the wafer can be held with a slight gap, such as 0.1 mm, from the table 4.

Moreover, the substrate table 4 is equipped with substrate-supporting pins 43 that will be knocked out upward through the table 4 by an elevating mechanism 44 so that each wafer W can be placed on the table 4 with an collaborating operation of the main transfer mechanism 25 and the supporting pins 43. Provided as surrounding the supporting pins 43 between the table 4 and the elevating mechanism 44 are bellows 45 to keep a decompressed state in an airtight chamber 40.

Placed on the substrate table 4 is a cover 5 elevatable with the help of an elevating mechanism (not shown). The cover 5 will be ascended when each wafer W is transferred into and then descended to constitute the airtight chamber 40 with the substrate table 4 for a low-pressure drying process.

Provided on top of the cover 5 is an exhaust opening 51 connected to a vacuum pump 53 thorough an exhaust passage such as a pipe 52, for decompressing the airtight chamber 40. Provided along the pipe 52 are a valve 54 and a pressure adjuster 55 for the chamber 40.

Moreover, provided above the substrate table 4 is a diffuser plate 6 so as to face each wafer W. The diffuser plate 6 is a circular plate of, for example, 5 mm in thickness, with a size almost equal to or larger than each wafer W. The size almost equal to the wafer W covers a device-forming region on the wafer W, hence it may be a little bit smaller than the wafer.

Figure 9:
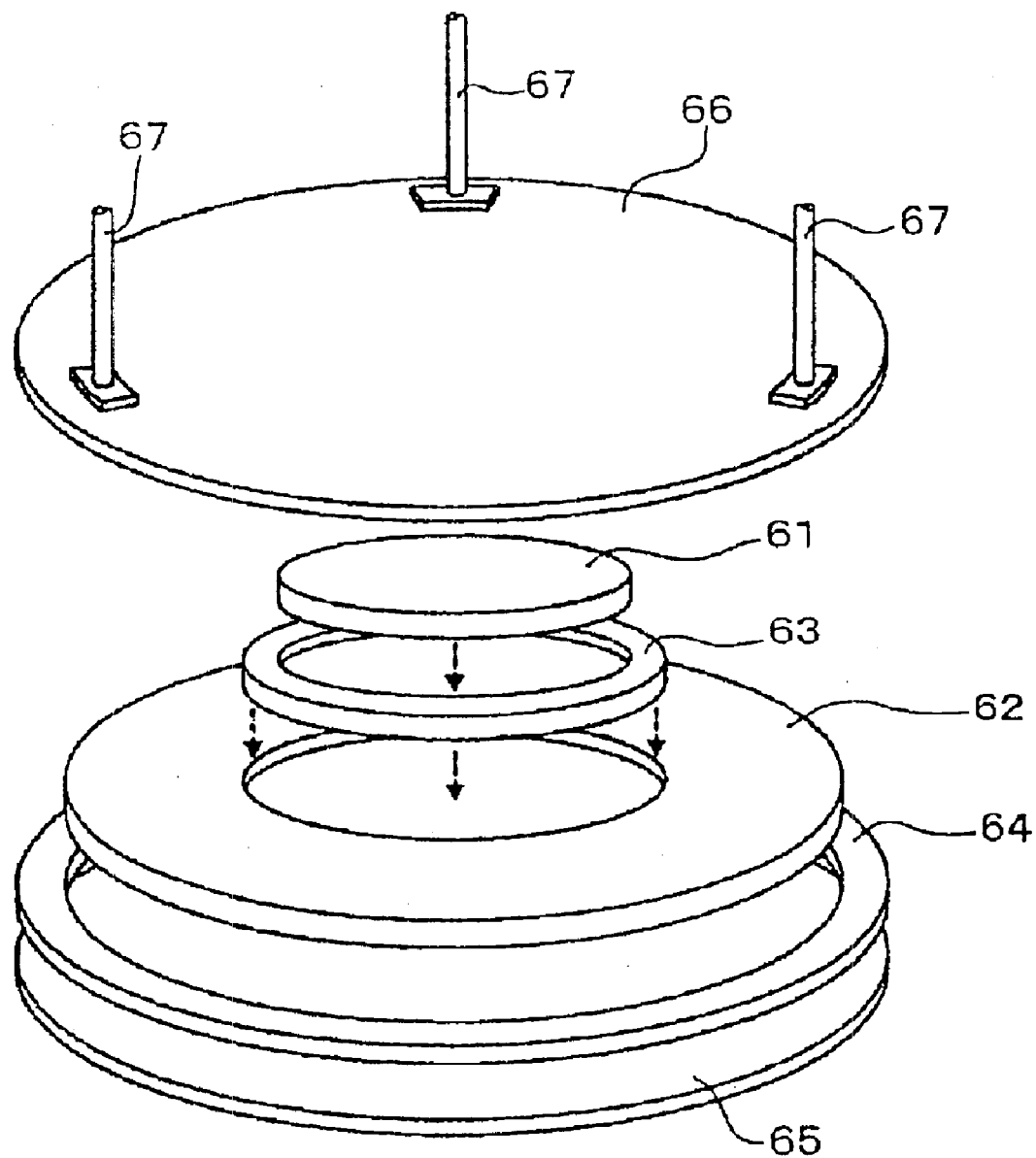
FIG. 9 shows a perspective view of a diffuser plate installed in the first embodiment of low-pressure dryer according to the present invention.

The diffuser plate 6 is equipped with a temperature adjuster, as shown in FIG. 9. In detail, provided in the center region of the diffuser plate 6 to face the center region of each wafer W is a first heater 61, such as, a circular flat heater of, for example, 80 mm in diameter. The first heater 61 is surrounded by a second heater 62, such as, a flat ring heater of, for example, 15 mm in width. Each flat heater is made of a resistive heating element having the corresponding shape sandwiched by two aluminum plates.

Provided between the outer edge of the first heater 61 and the inner edge of the second heater 62 is a ring heat insulator 63 of, for example, 5 mm in width. Provided around the second heater 62 is a ring heat insulator 64 of, for example, 5 mm in width. Both heat insulators are made of, for example, glass wool.

Fixed on the lower surface of the diffuser plate 6 is a heat-equalizing plate 65 made of, for example, 0.1-mm-thick aluminum foil, to offer uniform temperature over the diffuser plate 6 heated by the first and the heaters 61 and 62. Fixed on the upper surface of the diffuser plate 6 is a cover plate 66.

The diffuser plate 6 is hung by support bars 67, for example, at three points on the cover plate 66. The support bars 67 penetrate through the cover 5, as shown in FIG. 8. A support bar 67a among the three bars 67 is connected to an elevating mechanism 68 having a ball screw mechanism. The other support bars 67 act as positioning-guide bars so that the diffuser plate 6 cannot be shifted left or right. The diffuser plate 6 can be ascended by the elevating mechanism 68 to a given height accurately.

A controller 7 shown in FIG. 8 has functions of controlling the first and the second heaters 61 and 62 of the diffuser plate 6 at their respective temperatures in accordance with sequential processing described later, and also controlling the elevating mechanism 68 and the pressure adjuster 55, in a wafer low-pressure drying process.

The wafer low-pressure drying process is disclosed with reference to FIGS. 10, 11A, 11B and 11C.

Figure 10:
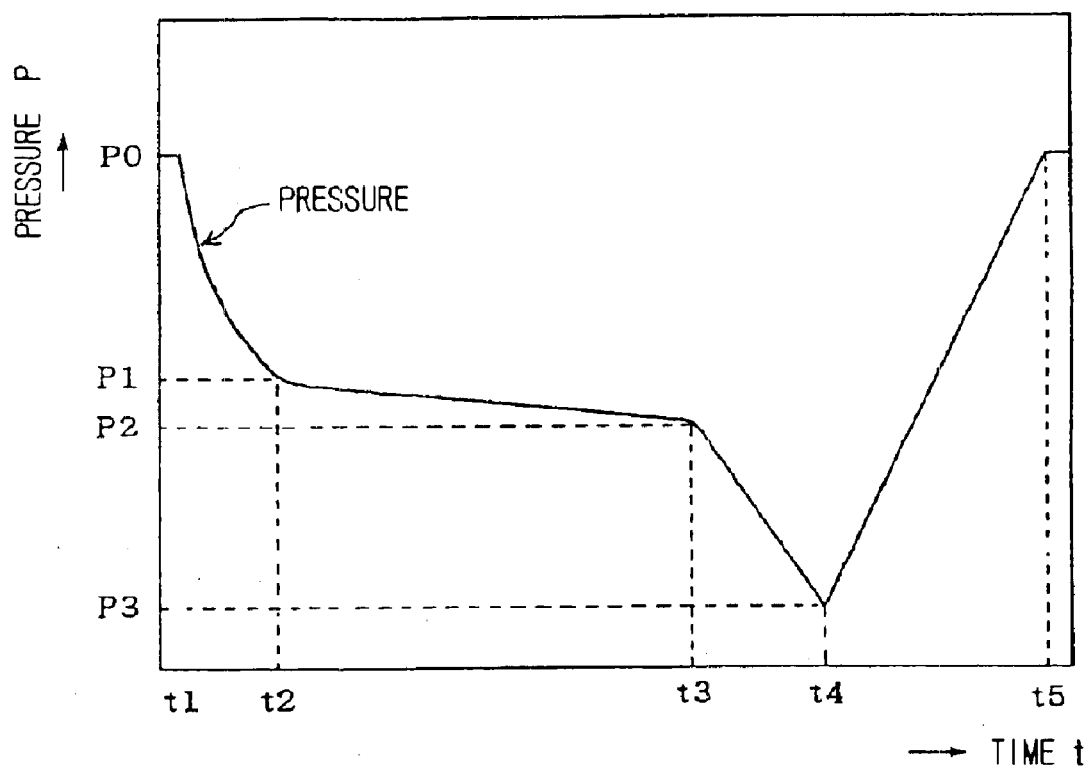
FIG. 10 shows a graph indicating change in pressure against elapse of time in an airtight chamber during a low-pressure drying process under the use of the first embodiment of low-pressure dryer according to the present invention.

At time t1, as shown in FIG. 10, a wafer W applied a coating solution "i" (FIG. 11A), as described before, is transferred into the low-pressure dryer (FIG. 8) while the cover 5 is opened. The wafer W is then placed on the table 4 by the main transfer mechanism 25 (FIG. 6) and with the help of the substrate-supporting pins 43, as shown in FIG. 8. The cover 5 is descended to form the airtight chamber 40 to enclose the wafer W. Descended next is the diffuser plate 6 to a position with a height L1 (FIG. 11A) such as 2 mm from the wafer surface. The wafer W is then heated to a temperature, for example, 30° C. higher than a clean-room temperature, such as 23° C., by the substrate-temperature adjuster 41. The valve 54 is opened to allow the vacuum pump 53 to start decompression. At the same time, the first and second heaters 61 and 62 of the diffuser plate 6 are heated. For example, the inner first heater 61 is heated to 90° C. while the outer second heater 62 is heated to 30° C. The pressure P inside the airtight chamber 40 is then rapidly decreased from the ambient pressure P0, as shown in FIG. 10.

Next, at time t2, for example, 30 seconds after time t1, pressure P inside the airtight chamber 40 reaches P1. The solvent in the coating solution "i" on the wafer W starts evaporation violently. The evaporating components then form an exhaust stream flowing from the wafer center to outside between the wafer W and the diffusing plate 6 with a slight gap.

The pressure P inside the airtight chamber 40 is adjusted by the pressure adjuster 55 to gradually decrease to P2 (pressure of solvent) at time t3. This gradual pressure decrease avoids roughness of the coating film on the wafer W due to violent evaporation of solvent.

Figure 11A:
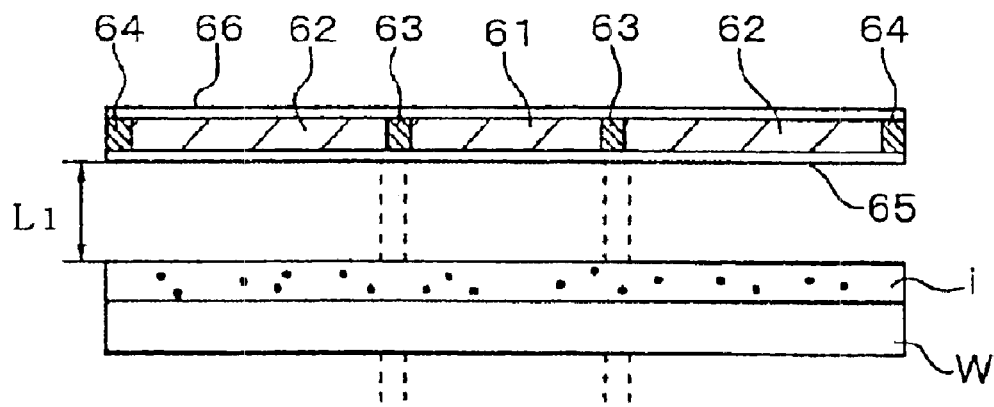
FIG. 11A shows vertical sections of a wafer and a diffuser plate.
Figure 11B:
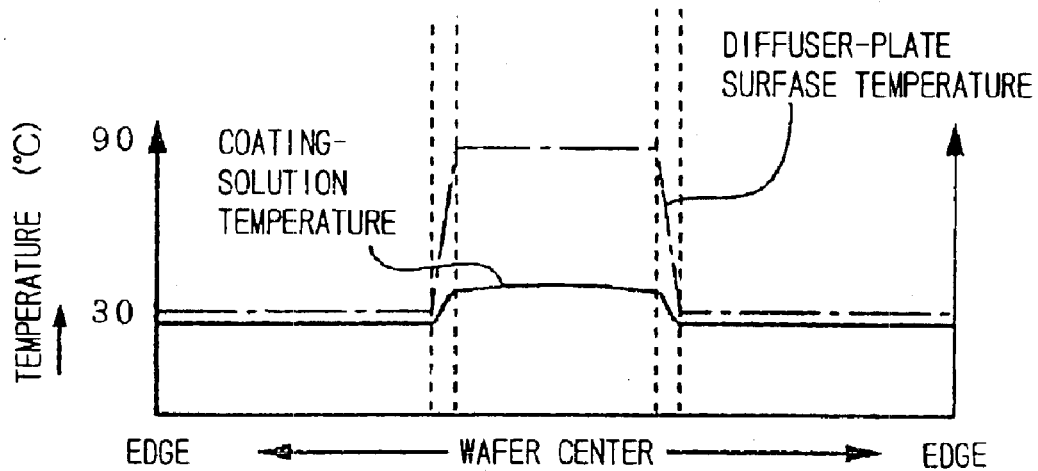
FIGS. 11B and 11C show temperature distributions during the low-pressure drying process under the use of the first embodiment of low-pressure dryer according to the present invention.
Figure 11C:
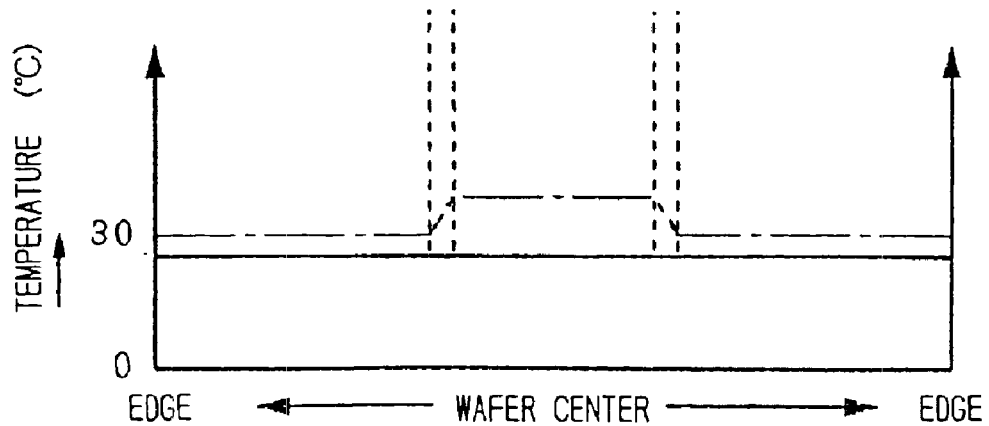

The temperatures of the coating solution "i" and the diffuser plate 6 while the solvent is violently evaporating are illustrated in FIGS. 11A to 11C. FIG. 11A shows the cross sections of the wafer W and the diffuser plate 6. FIGS. 11B and 11C show the temperatures of the corresponding cross-section regions. Solid and dashed lines in FIGS. 11B and 11C indicate the temperature of the coating solution "i" and the surface temperature of the differ plate 6, respectively.

As shown in FIG. 11B, heat generated by the first and the second heaters 61 and 62 are transferred to the heat-equalizing plate 65 so that the temperature of each heater becomes uniform. The surface temperatures of the heat-equalizing plate 65 reach 90° C. on its center region corresponding to the first heater 61 and 30° C. on its outer regions corresponding to the second heater 62. The first and the second heaters 61 and 62 are thermally isolated from each other by the heat insulator 63 to avoid mutual interference in temperature control. The sections of the heat-equalizing plate 65 touching the heat insulator 63 exhibit a temperature gradient from the center-region temperature (90° C.) to the outer-region temperature (30° C.).

The coating solution "i" formed on the wafer W is then heated by radiant heat from the diffuser plate 6 with the temperature profile discussed above. In detail, the coating solution "i" on the wafer center region reaches, for example, 35 to 40° C. due to radiant heat from the first heater 61 whereas that on the wafer outer regions reaches, for example, 27 to 30° C. due to radiant heat from the second heater 62.

With advancements in solvent evaporation, the surface temperature of the diffuser plate 6 gradually decreases due to heat radiation. The temperature of the coating solution "i" also decreases due to heat of evaporation. In detail, the temperature of the coating solution "i" on the wafer center region decreases quicker than that on the wafer outer regions.

A coating film of polyimide contained in the coating solution "i" is then formed on the wafer W, as solvent evaporation advances.

Figure 1:
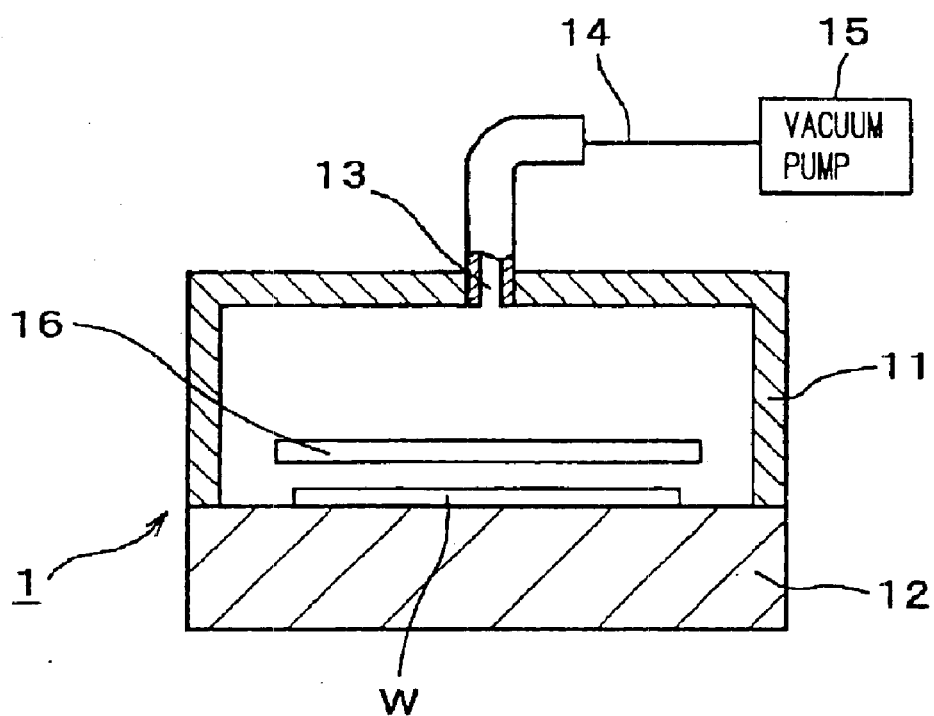
FIG. 1 schematically illustrates a known low-pressure dryer.

At time t4 (FIG. 10), the solvent has almost evaporated, for example, the temperature of the center region of the diffuser plate 6 reaches 35 to 40° C. whereas that of the outer regions reaches 25° C., and the temperature of the coating solution "i" on the wafer outer regions reaches 25° C. whereas that of the coating solution "i" on the wafer center region reaches the temperature same as the wafer outer regions or a slightly lower temperature, as shown in FIG. 1C.

While the coating film is being formed, evaporating gaseous solvent and air in the airtight chamber 40 are discharged therefrom. The pressure in the chamber 40 thus rapidly decreases from P2 to P3 at time t4. The valve 52 is then closed to halt decompression.

A purge gas such as nitrogen (inert gas) is then supplied into the airtight chamber 40 by a gas supplier (not shown) so that the pressure P in the chamber 40 can return to the ambient pressure P0 at time t5. The wafer W is then taken out from the chamber 40, thus the low-pressure drying process being complete.

As disclosed, in the first embodiment, the coating solution "i" formed on each wafer W is heated by radiant heat from the diffuser plate 6 with temperature adjustments to the center region at high whereas to the outer regions at low.

In other words, the coating solution "i" on the wafer center region is preheated to a high temperature to match the temperature difference due to difference in solvent evaporation between the wafer center and outer regions.

It is known that the solvent evaporation speed depends on difference in density between solvent in the coating solution "i" and gaseous solvent components in the vicinity of the solution surface.

Therefore, the solvent on the wafer center region will rapidly evaporate compared to that on the wafer outer regions. The temperature of the coating solution "i" on the wafer center region will thus be decreased quicker than that on the wafer outer regions, due to heat of evaporation.

However, in the first embodiment, the coating solution "i" on the wafer center region is preheated to a high temperature to achieve small temperature difference for the solution "i" over the wafer center and outer regions as solvent evaporation advances, to form a coating film. This is a major difference of the first embodiment from the known low-pressure drying technique in which a coating film is formed at large temperature difference over the wafer center and outer regions.

Therefore, in the first embodiment, the surface tension will thus be uniform over the wafer center and outer regions so that the coating solution "i" on the wafer outer regions cannot be attracted to the center region or at small degree if attracted. The first embodiment thus achieves formation of a uniform coating film over the wafer surface.

Figure 12:
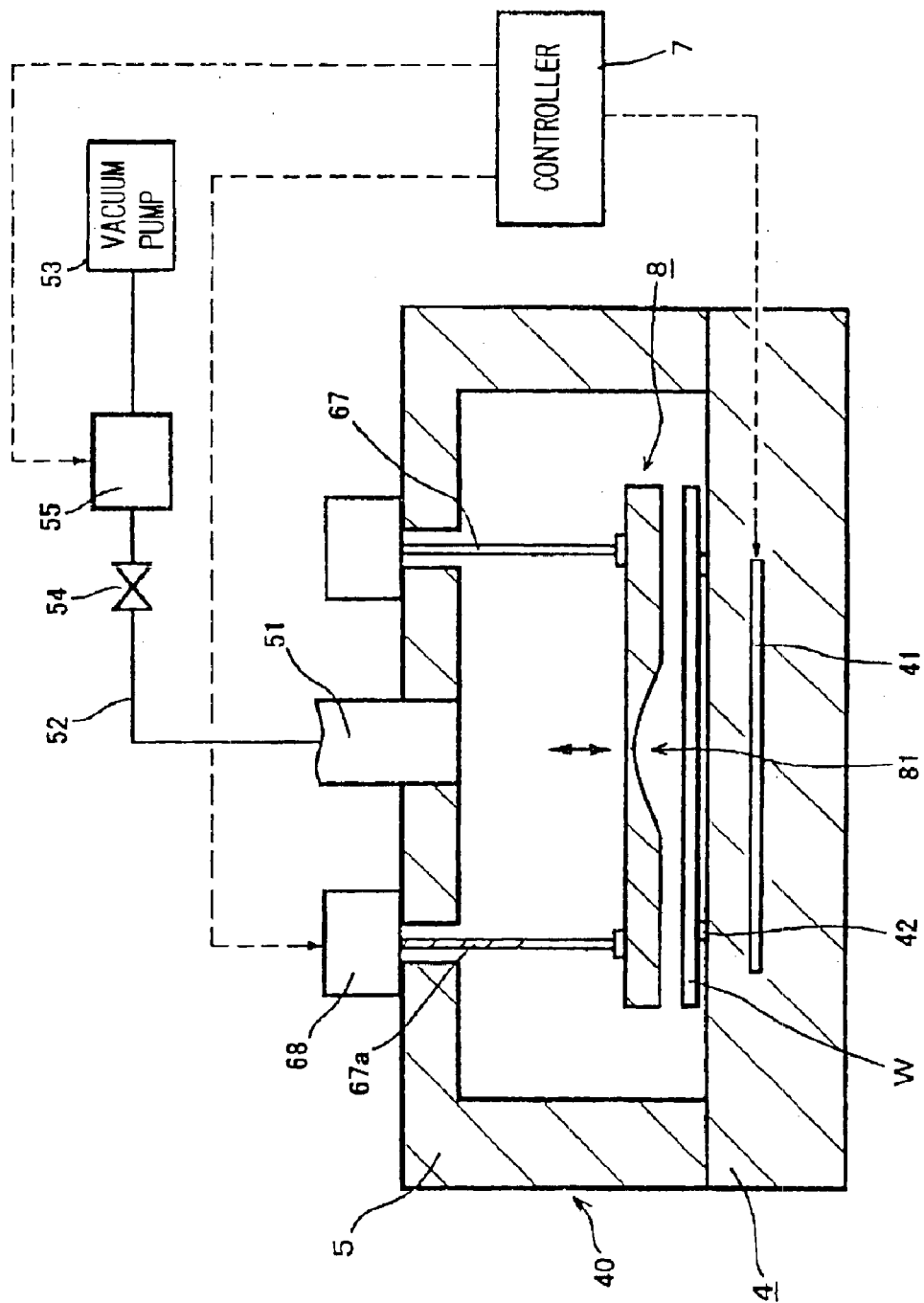
FIG. 12 shows a vertical section of a second embodiment of low-pressure dryer according to the present invention.

Disclosed next with respect to FIG. 12 is a second embodiment of low-pressure dryer according to the present invention. Elements shown in FIG. 12 the same as or analogous to the elements shown in FIG. 8 are referenced by the same numerals and not explained in detail.

The low-pressure dryer shown in FIG. 12 is equipped with a diffuser plate 8 having a concavity at its lower side, as facing each wafer W.

Figure 13:
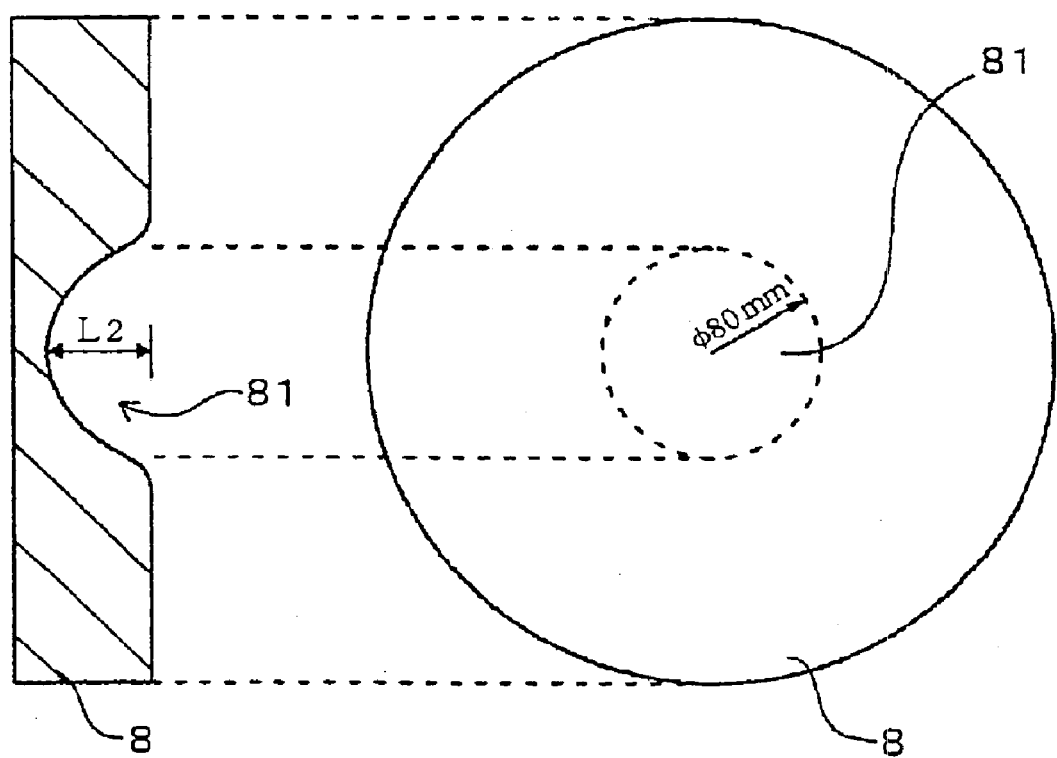
FIG. 13 illustrates a diffuser plate installed in the second embodiment of low-pressure dryer according to the present invention.

The diffuser plate 8 is a circular plate, as shown in FIG. 13, having a thickness of, for example, 60 mm, with a size almost equal to or larger than each wafer W. Formed on the center region of the diffuser plate 8 to face the center region of each wafer W is a concavity 81 having a diameter of, for example, 80 mm and the maximum depth L2 of, for example, 50 mm, with a chevron shape at the vertical cross section. The height of the diffuser plate 8 is adjusted to have, for example, 0.5 mm in gap L3 between the plate and the wafer W, as shown in FIG. 14, for low-pressure drying process.

The concavity 81 of the diffuser plate 8 formed to match the center region of each wafer W creates a large space between the plate and the wafer so that gaseous solvent components evaporating from the wafer center region can stay in the large space. The density gradient of solvent from the surface of a coating solution "i" on the wafer W to the gaseous solvent components staying over the wafer W will thus be mild to cause slowdown in evaporation speed to minimize the difference in evaporation speed between wafer center and outer regions. The minimized evaporation-speed difference will suppress the swell of a coating film on the wafer center region, thus offering uniformity of film thickness over the wafer surface. The gap L3 between the diffuser plate 8 and each wafer W is, for example, 0.5 mm, although exaggerated in FIG. 14 for easier understanding of the invention.

Figure 2:
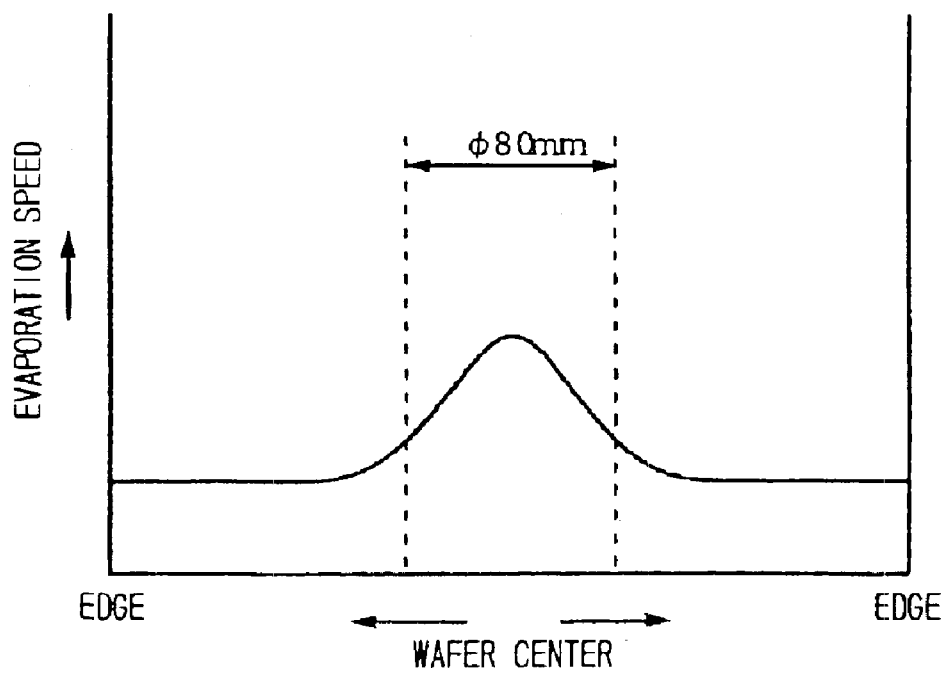
FIG. 2 shows a distribution of solvent evaporation speed under the use of the known low-pressure dryer.
Figure 3:
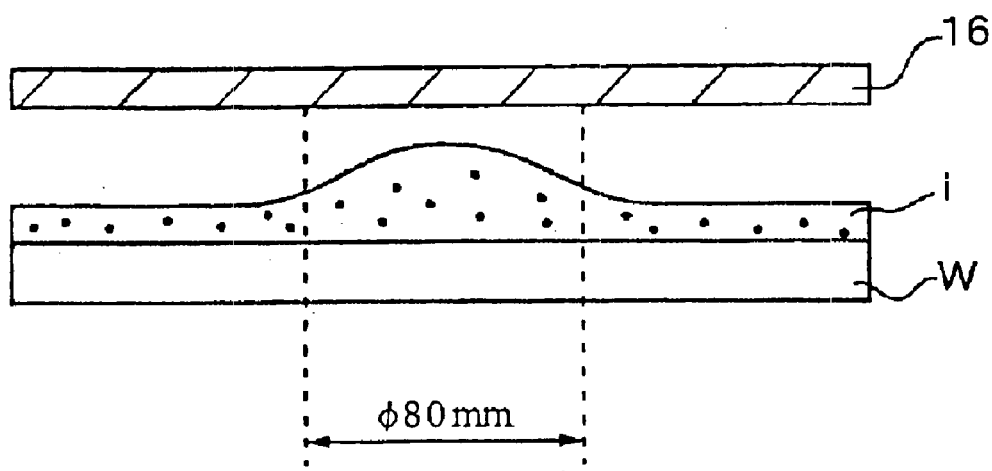
FIG. 3 illustrates a coating film formed on a wafer under the use of the known low-pressure dryer.
Figure 4A:
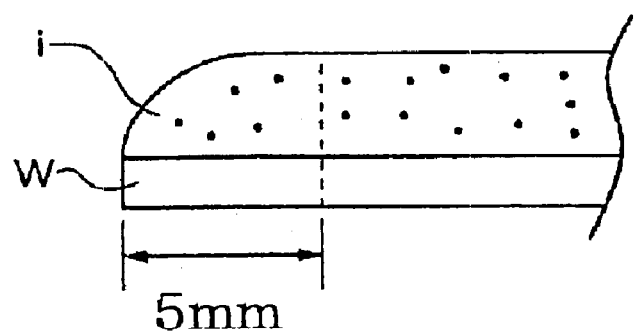
FIGS. 4A and 4B also illustrate a coating film formed on a wafer under the use of the known low-pressure dryer.
Figure 4B:
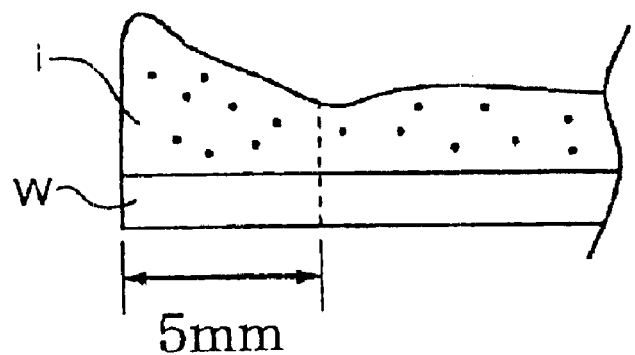

The concavity 81 of the diffuser plate 8 may have a rectangular shape at the vertical cross section but the chevron shape is the best choice to match the quadratic curve of the evaporation speed, higher, as close to the wafer center, as shown in FIG. 2.

Figure 14:
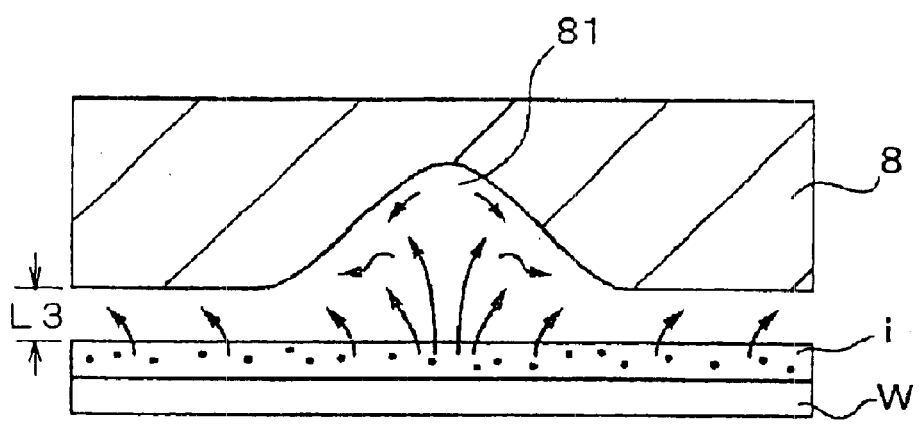
FIG. 14 illustrates a coating film formed on a wafer during the low-pressure drying process under the use of the second embodiment of low-pressure dryer according to the present invention.

The gap L3 between the diffuser plate 8 and each wafer W, shown in FIG. 14, is not only 0.5 mm but preferably in the range from 0.1 to 20 mm. It is preferable to decide the gap L3 beforehand under test film coating in accordance with the type of coating solution "i". The gap L3 decided under test film coating can also be set by the elevating mechanism 68 (FIG. 12) between the diffuser plate 8 and each wafer W, to form an evaporation space to generate an exhaust stream therebetween suitable for the type of coating solution "i" to be used. The gap adjustments under test film coating can also offer uniformity of coating-film thickness over the wafer surface.

Disclosed next is an embodiment of film coating, based on the coating technique shown in FIG. 7, to apply a coating solution as thinner on the wafer center region but thicker on the wafer outer regions, with adjustments to the travel speed of a coating nozzle over each wafer W.

Figure 15:
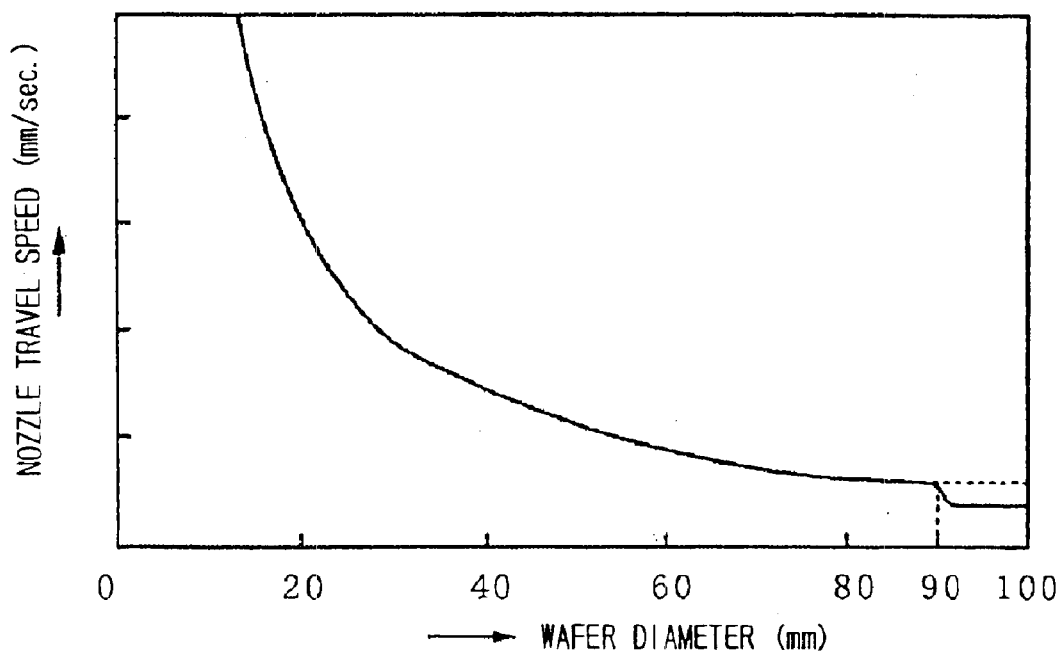
FIG. 15 shows a characteristic curve indicating the relationship between wafer diameter and nozzle travel speed under another coating technique of forming a coating film to be subjected to a low-pressure drying process.

In detail, as shown in FIG. 15, adjustments are made to the travel speed of the dispenser nozzle 31 while spraying the coating solution "i" on each rotating wafer W while traversing over the wafer W in wafer-radius direction in such way that the travel speed is decreased when the dispenser nozzle 31 passes over the wafer surface at, for example, 90 mm in diameter from the wafer center, to apply much coating solution "i" at the wafer outer regions than the center region.

Figure 16A:
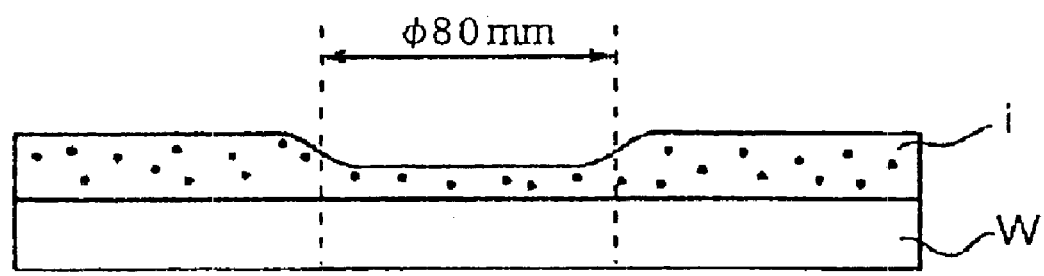
FIGS. 16A and 16B illustrate a coating film formed on a wafer by the coating technique shown in FIG. 15 and subjected to the low-pressure drying process.

Illustrated in FIG. 16A is a coating film formed on each wafer W under the coating technique disclosed above, for example, at 10 $\mu$m on the wafer center region and 12 $\mu$m on the wafer outer regions.

Figure 16B:
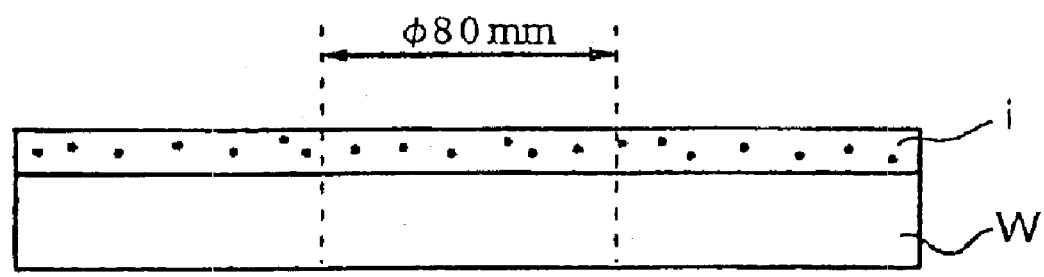

The wafer W coated with the coating film is then subjected to low-pressure drying process. As already discussed, the solvent evaporation speed is higher on the wafer center region than the wafer outer regions, thus causing difference in temperature of coating solution between the wafer center and outer regions, with higher surface tension for the coating solution on the wafer center region than the outer regions. Therefore, the coating solution "i" on the wafer outer regions is attracted to the wafer center region, thus film thickness being uniform, as illustrated in FIG. 16B.

In other words, the pre-application of coating solution on the wafer outer regions at an amount matching the amount of solution to be attracted to the wafer center region offers uniform thickness to the coating film formed over the wafer surface as solvent evaporating.

Figure 17:
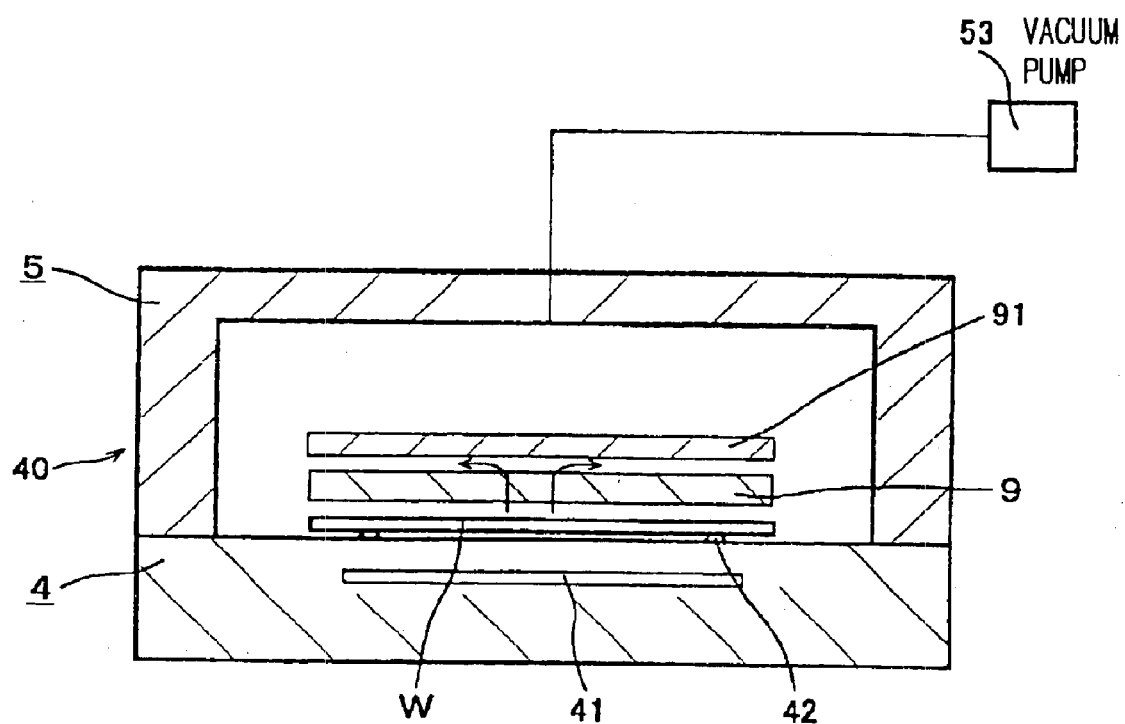
FIG. 17 shows a vertical section of a modification to the first embodiment of low-pressure dryer according to the present invention.

Disclosed next with reference to FIG. 17 is still another embodiment according to the present invention.

Provided as facing each wafer W in a low-pressure dryer in FIG. 17 is a ventilation resistive element 9 made of, for example, a circular ceramic shaving a thickness of 10 mm, almost the same size as or larger than wafers W, elevatable by an elevating mechanism (not shown).

Provided over the ventilation resistive element 9 is a diffuser plate 91 having a thickness of, for example, 3 mm, almost the same size as or larger than wafers W, elevatable by the elevating mechanism 68 (FIG. 8).

Other elements shown in FIG. 17 the same as or analogous to the elements shown in FIG. 8 are referenced by the same numerals and not explained in detail.

In this embodiment, gaseous solvent components evaporating from a coating solution "i" will pass through the ventilation resistive element 9 upward but flow laterally, as being spread outside in all directions, due to the existence of the diffuser plate 91. The flow of evaporating solvent components provides uniformity of solvent density which may otherwise vary from the surface of coating solution "i" on each wafer W to a space close to the wafer surface. This results in minimized difference in evaporation speed between the wafer center and outer regions, thus achieving the same advantages as discussed in the former embodiments.

In this invention disclosed so far, the first heater 61 provided on the diffuser plate 6 (FIG. 9) or the concavity 81 formed on the diffuser plate 9 (FIG. 13) may not have the 80-mm-circular region as disclosed but decided in accordance with the size of wafers W. In detail, they may be provided on a circular region having a diameter of about 40%±10% to the wafer diameter. For example, the first heater 61 or the concavity 81 may be provided on a circular region having a diameter in the range from 80 to 90 mm to 8-inch wafers W (200 mm in diameter). Or, they may be provided on a circular region having a diameter of 60 mm to small 6-inch wafers W (150 mm in diameter). Moreover, they may be provided on a circular region having a diameter of 120 mm to large 12-inch wafers W (300 mm in diameter).

All of these sizes for the first heater 61 provided on the diffuser plate 6 (FIG. 9) or the concavity 81 formed on the diffuser plate 9 can create uniform surface tension for the coating solution "i" over the wafer surface, thus achieving the same advantages as discussed in the former embodiments.

The diffuser plate in the present invention may not be limited to those in the former embodiments. For example, it may a combination of the diffuser-plate structures (FIGS. 9 and 13), as shown in FIG. 18.

Figure 18:
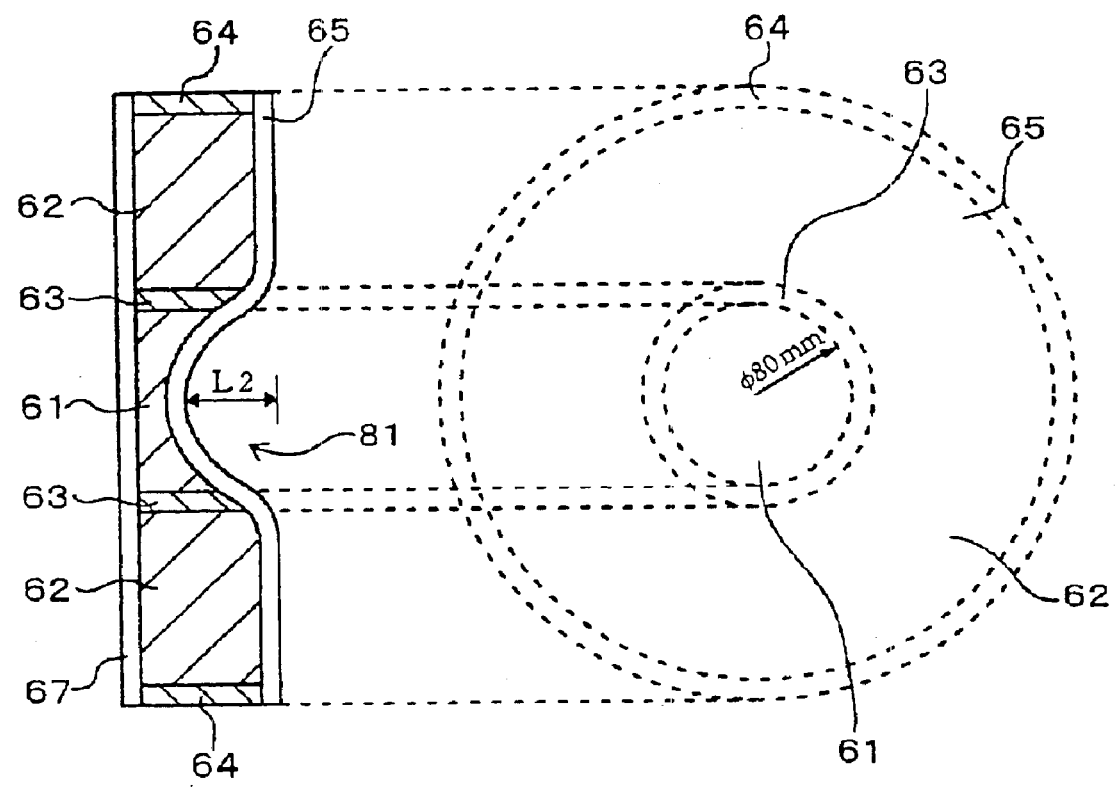
FIG. 18 illustrates another type of diffuser plate according to the present invention.

Moreover, the coating technique discussed with respect to FIG. 15, with adjustments to nozzle travel speed, for coating wafers W at low thickness on the wafer center region but high thickness on the wafer outer regions, can be applied to the low-pressure dryer shown in FIG. 8 or 12, or that with the diffuser plate shown in FIG. 18. All of these combinations achieve uniformity of coating-film thickness over the wafer surface.

Figure 19:
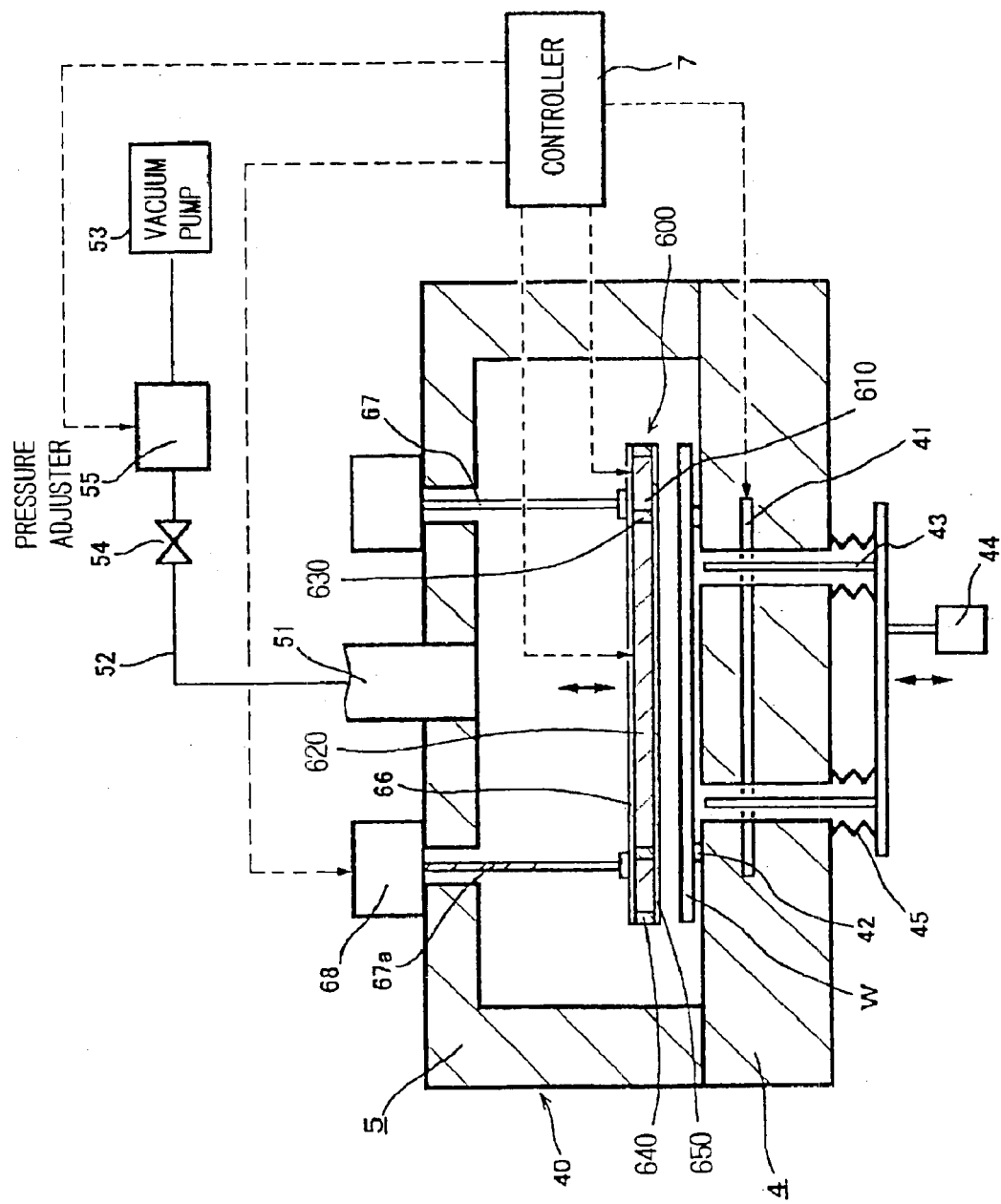
FIG. 19 shows a vertical section of another modification to the first embodiment of low-pressure dryer according to the present invention shown in FIG. 8.

Disclosed next with reference to FIG. 19 is a modification to the first embodiment of low-pressure dryer shown in FIG. 8, equipped with a diffuser plate 600 different from the counterpart 6 in the first embodiment.

Elements other than the diffuser plate 600 in this modification (FIG. 19) the same as or analogous to the elements shown in the first embodiment (FIG. 8) are referenced by the same numerals and not explained in detail.

The diffuser plate 600 is provided above the substrate table 4 so as to face each wafer W. The diffuser plate 600 is a circular plate containing a temperature adjuster, of, for example, 5 mm in thickness, with a size almost equal to or larger than each wafer W. The size almost equal to the wafer W covers a device-forming region on the wafer W, hence it may be a little bit smaller than the wafer.

Figure 20:
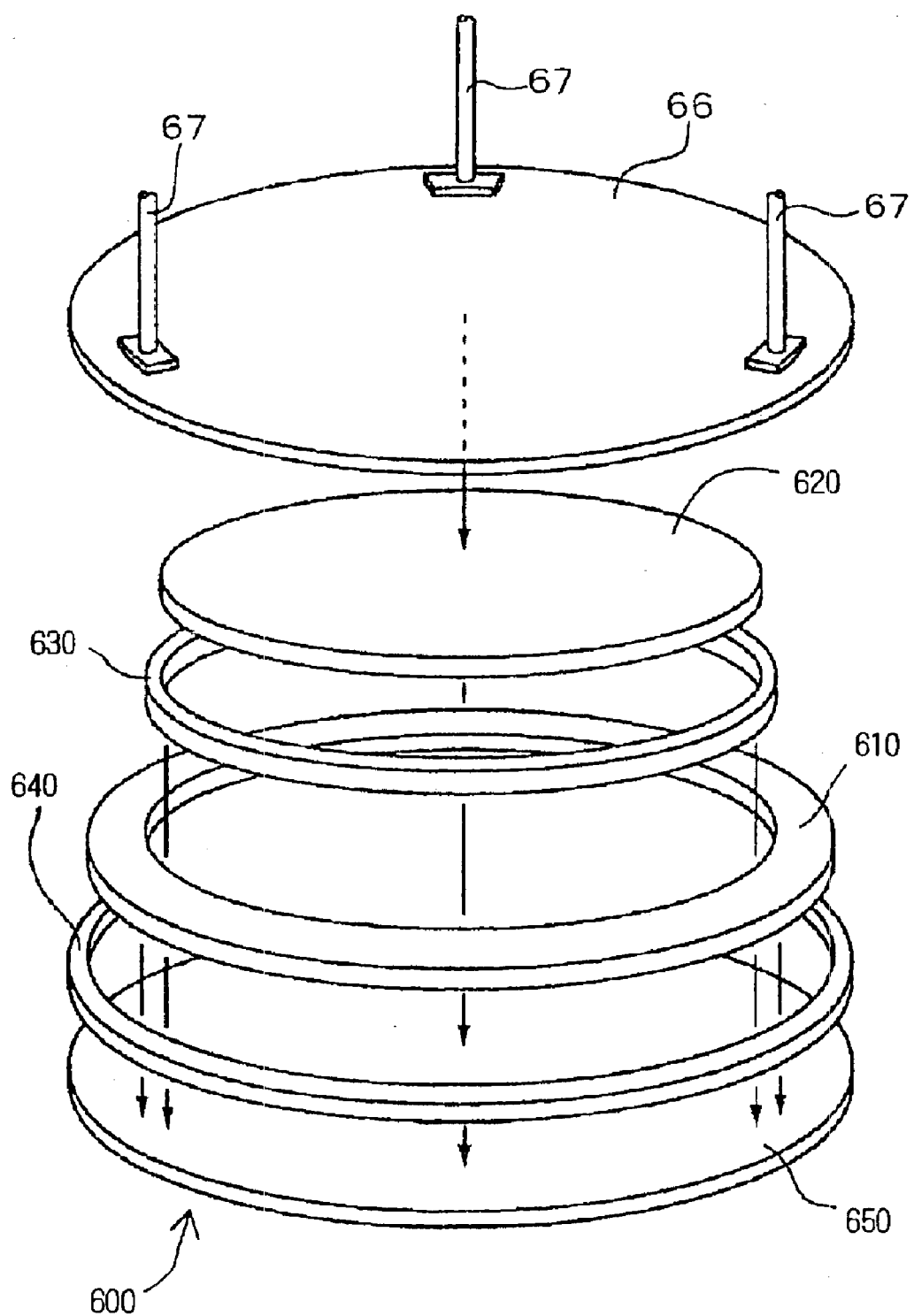
FIG. 20 shows a perspective view of a diffuser plate installed in the low-pressure dryer shown in FIG. 19.

As shown in FIG. 20, the diffuser plate 600 is equipped with a first heater 610, such as, a flat ring heater, to match the region of each wafer W, for example, having a width of 10 mm±5 mm from the wafer outer regions. Provided inside the first heater 610 is a second heater 620, such as, a circular flat heater. Each flat heater is made of a resistive heating element having the corresponding shape sandwiched by two aluminum plates.

Provided between the inner edge of the first heater 610 and the outer edge of the second heater 620 is a ring heat insulator 630 of, for example, 5 mm in width. Provided around the first heater 610 is a ring heat insulator 640 of, for example, 5 mm in width. Both heat insulators are made of, for example, glass wool.

Attached to the lower surface of the diffuser plate 600 is a heat-equalizing plate 650 made of, for example, 0.1-mm-thick aluminum foil, to offer uniform temperature over wafer regions heated by the first and the heaters 610 and 620. Fixed on the upper surface of the diffuser plate 600 is the cover plate 66, like the diffuser plate 6 shown in FIG. 9.

Like the diffuser plate 6, the diffuser plate 600 hung by the support bars 67, for example, at three points on the cover plate 66. The support bars 67 penetrate through the cover 5, as shown in FIG. 19. The support bar 67a among the three bars 67 is connected to the elevating mechanism 68 having a ball screw mechanism. The other support bars 67 act as positioning-guide bars so that the diffuser plate 600 cannot be shifted left or right. The diffuser plate 600 can be ascended by the elevating mechanism 68 to a given height accurately.

The controller 7 shown in FIG. 19 has functions of controlling the first and the second heaters 610 and 620 of the diffuser plate 600 at their respective temperatures in accordance with sequential processing described later. It also controls the elevating mechanism 68 and the pressure adjuster 55, in a wafer low-pressure drying process.

Figure 21A:
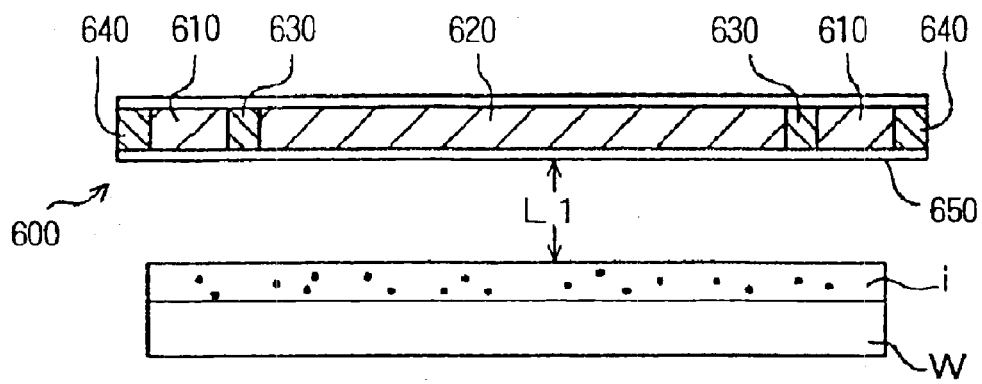
FIG. 21A shows vertical sections of a wafer and a diffuser plate.
Figure 21B:
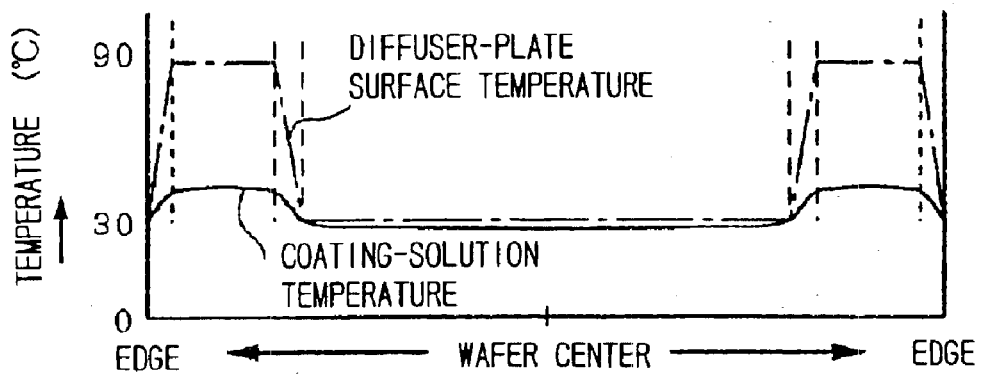
FIGS. 21B and 21C show temperature distributions during the low-pressure drying process under the use of the low-pressure dryer shown in FIG. 19.
Figure 21C:
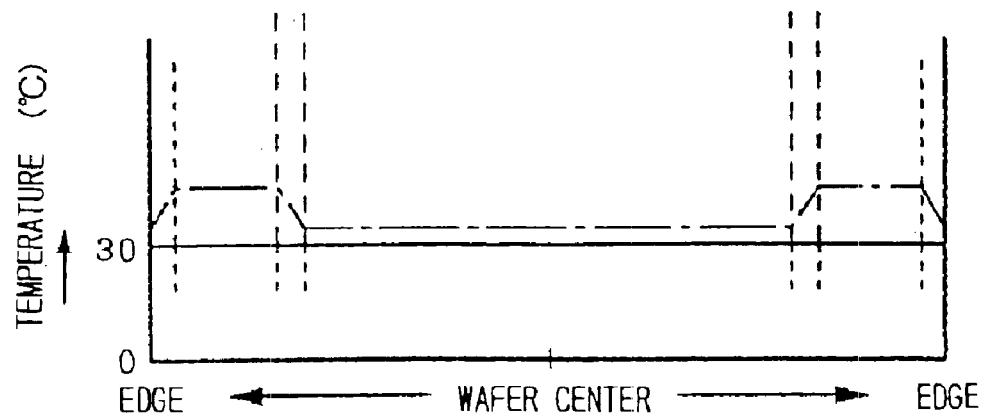

The wafer low-pressure drying process in this modification is disclosed with reference to FIG. 10 used in the disclosure of the first embodiment, and also FIGS. 21A, 21B and 21C.

At time t1, as shown in FIG. 10, a wafer W applied a coating solution "i" (FIG. 21A), as described before, is transferred into the low-pressure dryer (FIG. 19) while the cover 5 is opened. The wafer W is then placed on the table 4 by the main transfer mechanism 25 (FIG. 6) and with the help of the substrate-supporting pins 43, as shown in FIG. 19. The cover 5 is descended to form the airtight chamber 40 to enclose the wafer W. Descended next is the diffuser plate 600 at a position with a height L1 (FIG. 21A) such as 2 mm from the wafer surface. The wafer W is then heated to a temperature, for example, 30° C. higher than the clean-room temperature, such as 23° C., by the substrate-temperature adjuster 41. The valve 54 is opened to allow the vacuum pump 53 to start decompression. At the same time, the first and second heaters 610 and 620 of the diffuser plate 600 are heated. For example, the outer first heater 610 is heated to 90° C. while the inner second heater 620 is heated to 30° C. The pressure P inside the airtight chamber 40 is then rapidly decreased from the ambient pressure P0, as shown in FIG. 10.

Next, at time t2, for example, 30 seconds after time t1, the pressure P inside the airtight chamber 40 reaches P1. The solvent in the coating solution "i" on the wafer W starts evaporation violently. The evaporating components then form an exhaust stream flowing from the wafer center to outside between the wafer W and the diffusing plate 600 with a slight gap.

The pressure P inside the airtight chamber 40 is adjusted by the pressure adjuster 55 to gradually decrease to P2(pressure of solvent) at time t3. This gradual pressure decrease avoid roughness of the coating film on the wafer W due to violent evaporation of solvent.

The temperatures of the coating solution "i" and the diffuser plate 600 while the solvent is violently evaporating are illustrated in FIGS. 21A to 21C. FIG. 21A shows the cross sections of the wafer W and the diffuser plate 600. FIGS. 21B and 21C show the temperatures of the corresponding cross-section regions. Solid and dashed lines in FIGS. 21B and 21C indicate the temperature of the coating solution "i" and the surface temperature of the differ plate 600, respectively.

As shown in FIG. 21B, heat generated by the first and the second heaters 610 and 620 are transferred to the heat-equalizing plate 650 so that the temperature of each heater becomes uniform. The surface temperatures of the heat-equalizing plate 650 reach 90° C. on its outer regions corresponding to the first heater 610 and 30° C. on its center region corresponding to the second heater 620. The first and the second heaters 610 and 620 are thermally isolated from each other by the heat insulator 630 to avoid mutual interference in temperature control. The sections of the heat-equalizing plate 650 touching the heat insulator 630 exhibit a temperature gradient from the center-region temperature (90° C.) to the outer-region temperature (30° C.).

The coating solution "i" formed on the wafer W is then heated by radiant heat from the diffuser plate 600 with the temperature profile discussed above. In detail, the coating solution "i" on the wafer outer region reaches, for example, 35 to 40° C. due to radiant heat from the first heater 610 whereas that on the wafer inner region reaches, for example, 27 to 30° C. due to radiant heat from the second heater 620.

With advancements in solvent evaporation, the surface temperature of the diffuser plate 600 gradually decreases due to heat radiation. The temperature of the coating solution "i" also decreases due to heat of evaporation. In detail, the temperature of the coating solution "i" on the wafer outer regions decreases quicker than that on the wafer center region.

A coating film of polyimide contained in the coating solution "i" is then formed on the wafer W, as solvent evaporation advances.

At time t4 (FIG. 10), the solvent has almost evaporated, for example, the temperature of the outer regions of the diffuser plate 600 reaches 35 to 40° C. whereas that of the inner region reaches 25° C., and the temperature of the coating solution "i" on the wafer inner region reaches 25° C. whereas that of the coating solution "i" on the wafer outer regions reaches the temperature same as the wafer inner region or a slightly lower temperature, as shown in FIG. 21C.

While the coating film is being formed, evaporating gaseous solvent and air in the airtight chamber 40 are discharged therefrom. The pressure in the chamber 40 thus rapidly decreases from P2 to P3 at time t4. The valve 52 is then closed to halt decompression.

A purge gas such as nitrogen (inert gas) is then supplied into the airtight chamber 40 by a gas supplier (not shown) so that the pressure P in the chamber 40 can return to the ambient pressure P0 at time t5. The wafer W is then taken out from the chamber 40, thus the low-pressure drying process being complete.

As disclosed, in this modification, the coating solution "i" on each wafer W is heated by radiant heat from the diffuser plate 600 with temperature adjustments to the outer regions at high whereas to the inner region at low.

In other words, the coating solution "i" on the wafer outer regions is preheated to a high temperature to match the temperature difference due to difference in solvent evaporation between the wafer outer and inner regions.

It is known that the solvent evaporation speed depends on difference in density between solvent in the coating solution "i" and gaseous solvent components in the vicinity of the solution surface.

Therefore, the solvent on the wafer outer regions will rapidly evaporate compared to that on the wafer inner region. The temperature of the coating solution "i" on the wafer outer regions will thus be decreased quicker than that on the wafer inner region, due to heat of evaporation.

However, in this modification, the coating solution "i" on the wafer outer regions is preheated to a high temperature to achieve small temperature difference for the solution "i" over the wafer center and outer regions as solvent evaporation advances, to form a coating film. This is a major difference of the modification embodiment from the known low-pressure drying technique in which a coating film is formed at large temperature difference over the wafer center and outer regions.

Therefore, in this modification, the surface tension will thus be uniform over the wafer center and outer regions so that the coating solution "i" on the wafer inner region cannot be attracted to the outer regions or at small degree if attracted. This modification thus achieves formation of a uniform coating film over the wafer surface.

This modification employs the heating mechanism shown in FIG. 19 in which each wafer W is heated from above by radiant heat.

Figure 22:
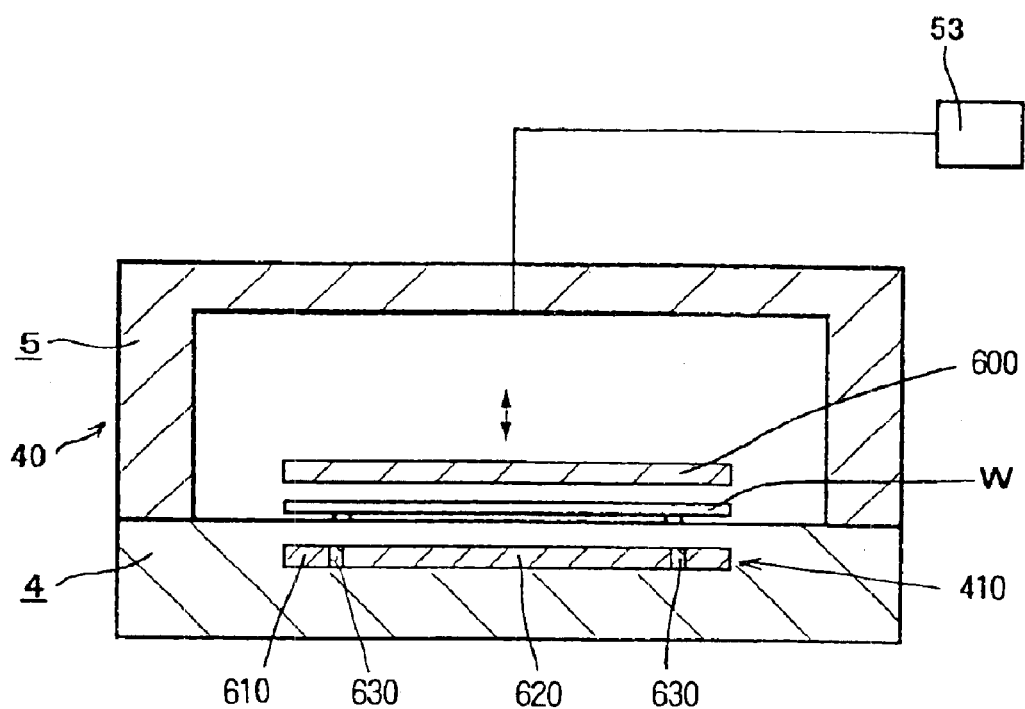
FIG. 22 illustrates a modification to a temperature adjuster installed in the low-pressure dryer shown in FIG. 19.

The heating mechanism may be altered by a mechanism, shown in FIG. 22, equipped with a substrate-temperature adjuster 410 that consists of elements equivalent to the first and the second heaters 610 and 620 and also the heat insulator 630.

In this alternative, a coating solution applied on each wafer W is heated by radiant heat from the substrate-temperature adjuster 410, through the wafer W, at high temperature for the outer regions than the inner region of the coating solution, thus achieving the same advantages discussed above.

Figure 23:
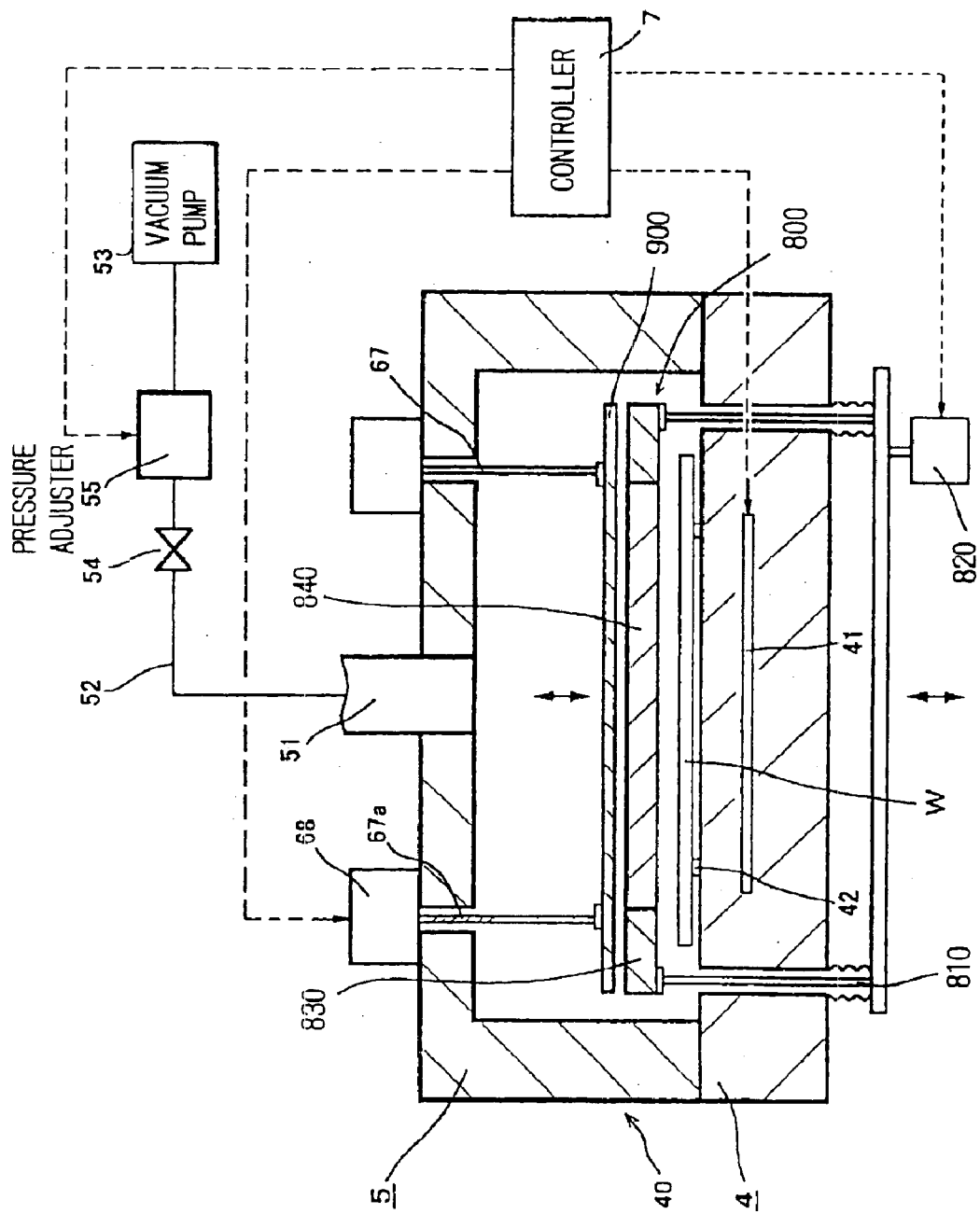
FIG. 23 shows a vertical section of a third embodiment of low-pressure dryer according to the present invention.

Disclosed next with respect to FIG. 23 is a third embodiment of low-pressure dryer according to the present invention. Elements shown in FIG. 23 the same as or analogous to the elements shown in the former embodiments are referenced by the same numerals and not explained in detail.

Provided in a low-pressure dryer in FIG. 23 is a ventilation resistive element 800 having a thickness of for example, 10 mm, almost the same size as or larger than wafers W, which allows gaseous solvent components evaporating from a coating solution to pass through the rear surface to upward. The resistive element 800 may be made of ceramics.

The ventilation resistive element 800 is supported by a supporting member 810 to face each wafer W, and elevatable by an elevating mechanism 820 under control by the controller 7.

Provided over ventilation resistive element 800 is a diffuser plate 900 having a thickness of, for example, 3 mm, almost the same size as or larger than wafers W, elevatable by the elevating mechanism 68.

The ventilation resistive element 800 is equipped with a first ventilation resistor 830, such as, a flat ring resistor 830, to match a region of each wafer W, for example, having a width of 10 mm from the wafer outer regions. Provided inside the first resistor 830 is a second ventilation resistor 840, such as, a circular flat resistor.

The first and the second ventilation resistors 830 and 840 are made of materials different in porosity so that the first resistor 830 exhibits lower permeability than the second resistor 840.

Figure 24:
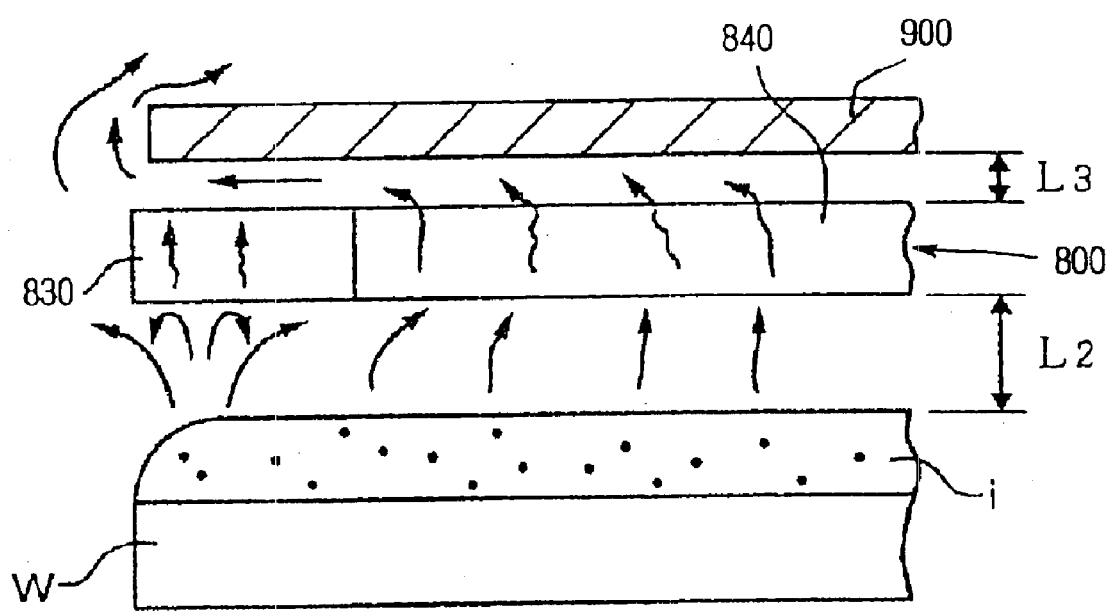
FIG. 24 illustrates a coating film formed on a wafer during the low-pressure drying process under the use of the third embodiment of low-pressure dryer according to the present invention.

Illustrated in FIG. 24 is a low-pressure drying process in the third embodiment with the ventilation resistive element 800 set over each wafer W with a gap L2 of, for example, 0.5 mm and the diffuser plate 900 set over the resistive element 800 with a gap L3 of, for example, 0.5 mm.

Gaseous solvent components evaporating from a coating solution "i" on the outer regions of each wafer W will hit the ventilation resistive element 800 and most of them will return to the coating-solution surface side, or few of them will pass through the resistive element 800 upward compared to those from the wafer inner region.

The evaporation of solvent from the wafer outer regions will therefore be restricted compared to that from the wafer inner region, thus the difference in evaporation being minimized between the wafer outer and inner regions. This results in restriction of variation in surface tension over the wafer surface, thus the coating film formed on the wafer outer regions being free from swelling, for enhanced uniformity of film thickness over the wafer surface during the low-pressure drying process.

The gaps L2 and L3 are, for example, 0.5 mm, although exaggerated in FIG. 24 for easier understanding of the invention.

Figure 25A:
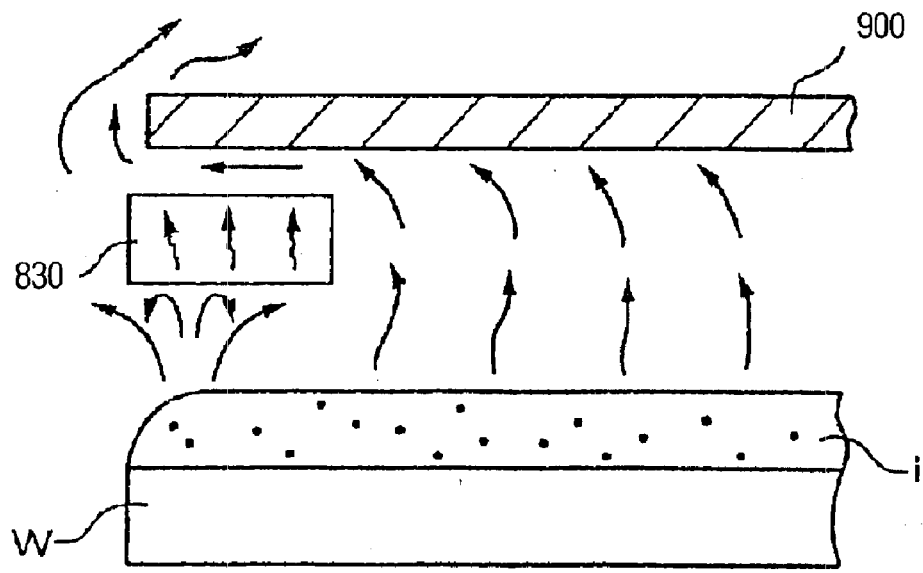
FIGS. 25A and 25B illustrate coating films formed on wafers during the low-pressure drying process under the use of modifications to a ventilation resistive element of the third embodiment of low-pressure dryer according to the present invention.
Figure 25B:
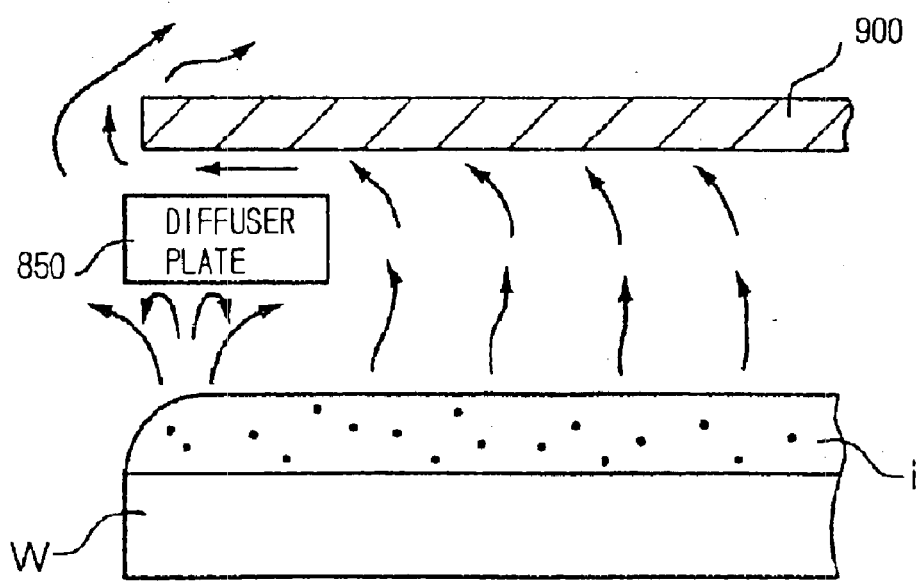

Illustrated in FIGS. 25A and 25B are alternatives to the ventilation resistive element 800 having the first and the second ventilation resistors 830 and 840, as disclosed above.

The alternatives have structures with ventilation resistance of zero for the second ventilation resistor 840 or infinite ventilation resistance for the first ventilation resistor 830, exhibiting lower permeability to the wafer outer regions than the wafer inner region.

In detail, shown in FIG. 25A is a ring ventilation resistive element made of the first ventilation resistor 830 only, which is equivalent to the ventilation resistance of zero for the second ventilation resistor 840. Shown in FIG. 25B is a diffuser plate 850 having the same shape as the first ventilation resistor 830, which is equivalent to the infinite ventilation resistance for the first ventilation resistor 830.

These alternatives also offer mild density gradient for solvent from the surface of a coating solution "i" on each wafer W to the gaseous solvent components staying over the wafer W, hence minimizing the difference in evaporation between wafer inner and outer regions, thus achieving the same advantages discussed above.

The gaps L2 and L3 shown in FIG. 24 are not limited to 0.5 mm. They may be set in the range from 0.5 to 30 mm, the best range being from 0.5 to 10 mm. It is preferable to decide these gaps under pre-coating tests in accordance with the type of coating solution.

Another modification to the present invention lies in temperature adjustments to the temperature of a coating solution applied on wafers W. In detail, the temperature of a coating solution applied on each wafer W by the coating system (FIG. 5) is controlled so that the temperature of a coating solution applied on each wafer W transferred to a low-pressure dryer is set at, for example, 25 to 27° C., lower than a set temperature at the substrate-temperature adjuster 41 (FIGS. 8, 12, 17, 19 and 23) by, for example, 3 to 5° C.

In detail, as illustrated in FIG. 26A, the substrate-temperature adjuster 41 starts pre-heating to the temperature-adjusting plate that consists of the table 4 and the adjuster 41 to, for example, 30° C., followed by wafer transfer into a dryer, for a low-pressure drying process.

As illustrated in FIG. 26B, a coating solution "i" applied on the transferred wafer W will be heated uniformly over the solution surface by radiant heat from the temperature-adjusting plate, as indicated by arrows. Nevertheless, the coating solution "i" applied on the wafer outer regions will be heated to a higher temperature than that on the wafer inner region due to roundness of the edge corner of the coating solution caused by surface tension.

As disclosed, this modification offers low-pressure drying with adjusted temperature differences for the coating solution between the wafer outer and inner regions, minimizing coating-solution temperature difference between the wafer outer regions subjected to active evaporation and the wafer inner region subjected to inactive evaporation during coating-film formation, thus achieving the same advantages discussed above.

Moreover, in this invention, the temperature of wafers W may be controlled as lower than that of a clean room in which the low-pressure dryer according to the present invention is installed, which is achieved by a cooling operation to the diffuser plate. This temperature adjustment also provides uniform surface tension of a coating solution over the wafer surface, thus forming coating films of uniform thickness over the wafer surface.

The several embodiments and modifications are applied to processing of semiconductor wafers. Not only that, the present invention is applicable to low-pressure drying processing to other substrates such as LCD substrates and photo-mask reticle substrates, and further formation of inter-layer insulating films and resist films in addition to device-protection films.

Explained below are several experiments to confirm the advantages of the present invention.

[Experiment I]

The experiment I employed the low-pressure dryer shown in FIG. 19 for the low-pressure drying process.

Applied on an 8-inch wafer (200 mm in diameter) was the coating solution containing polyimide and thinner having a high boiling point with the coating technique disclosed with reference to FIG. 7.

The wafer W was set in the low-pressure dryer and then the cover 5 was descended to form the airtight chamber 40. It was heated to 23° C. by the substrate-temperature adjuster 41 while the diffuser plate 600 was descended to have a gap L1 (FIG. 21A) of 10 mm with the wafer W. Temperature adjustments were made to the outer first heater 610 at 100° C. and the inner second heater 620 at 23° C. The vacuum pump 53 started for the low-pressure drying process.

[Experiment II]

The experiment II had the temperature adjustment to the first heater 610 at 70° C. different from the experiment I, the other requirements being the same.

[Experiment III]

The experiment III had the temperature adjustment to the first heater 610 at 50° C. different from the experiments I and II, the other requirements being the same.

[Comparative Experiment]

The comparative experiment had no heating operations to the first and the second heaters 610 and 620, the other requirements being the same as the experiment I.

[Observation of Experiment I and Comparative Experiment]

Figure 27:
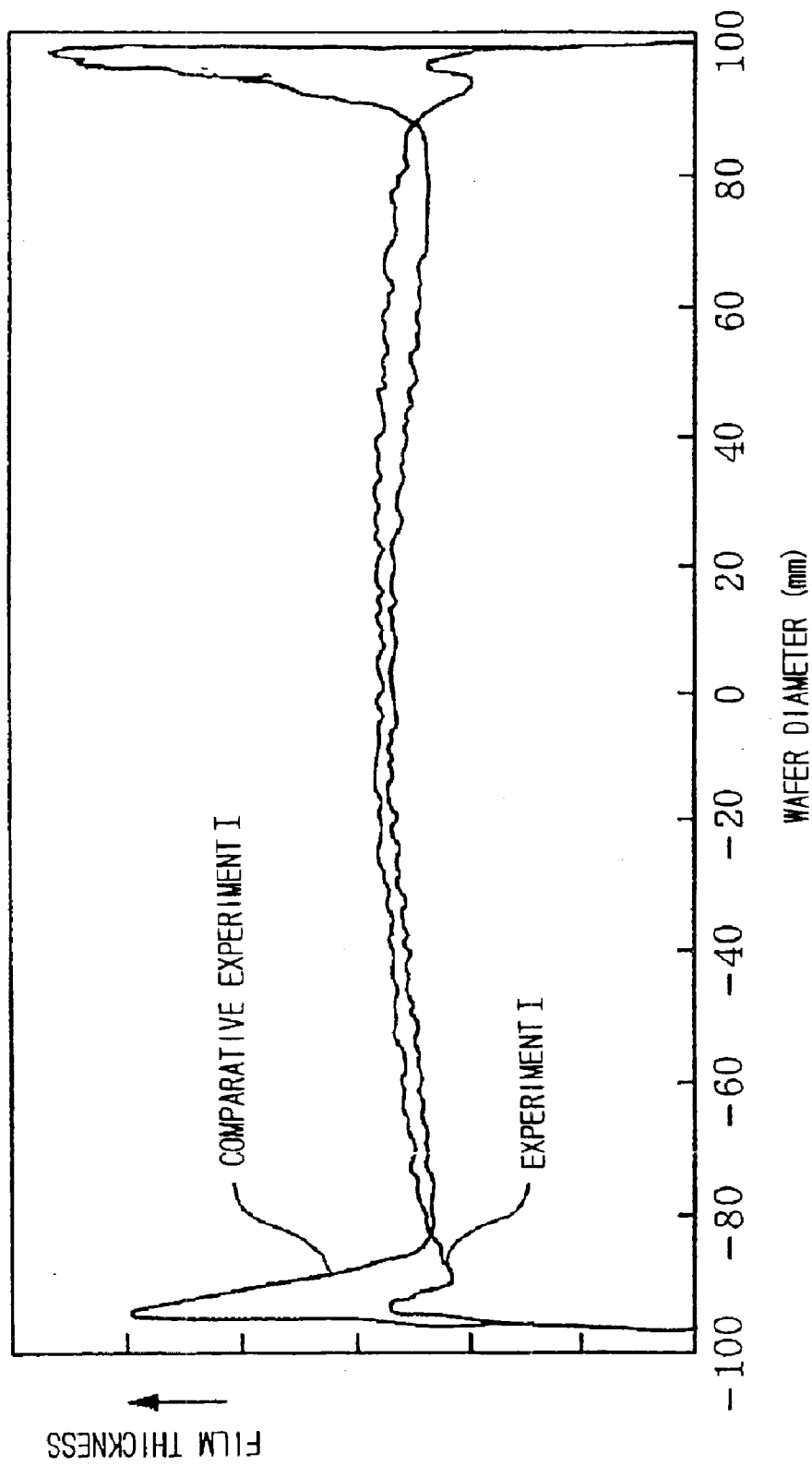
FIG. 27 show characteristic curves indicating results of experiments for confirming advantages of the present invention.

Shown in FIG. 27 are the thickness of the coating films formed under the experiment I and the comparative experiment. The graphs teach that the coating film formed under the experiment I had small swell on the wafer outer regions compared to that formed under the comparative experiment. It is confirmed that the heated diffuser plate 600 minimizes the difference in surface tension of the coating solution between the wafer outer and inner regions, for the low-pressure drying process.

[Observation of Experiments I, II and III]

Figure 28:
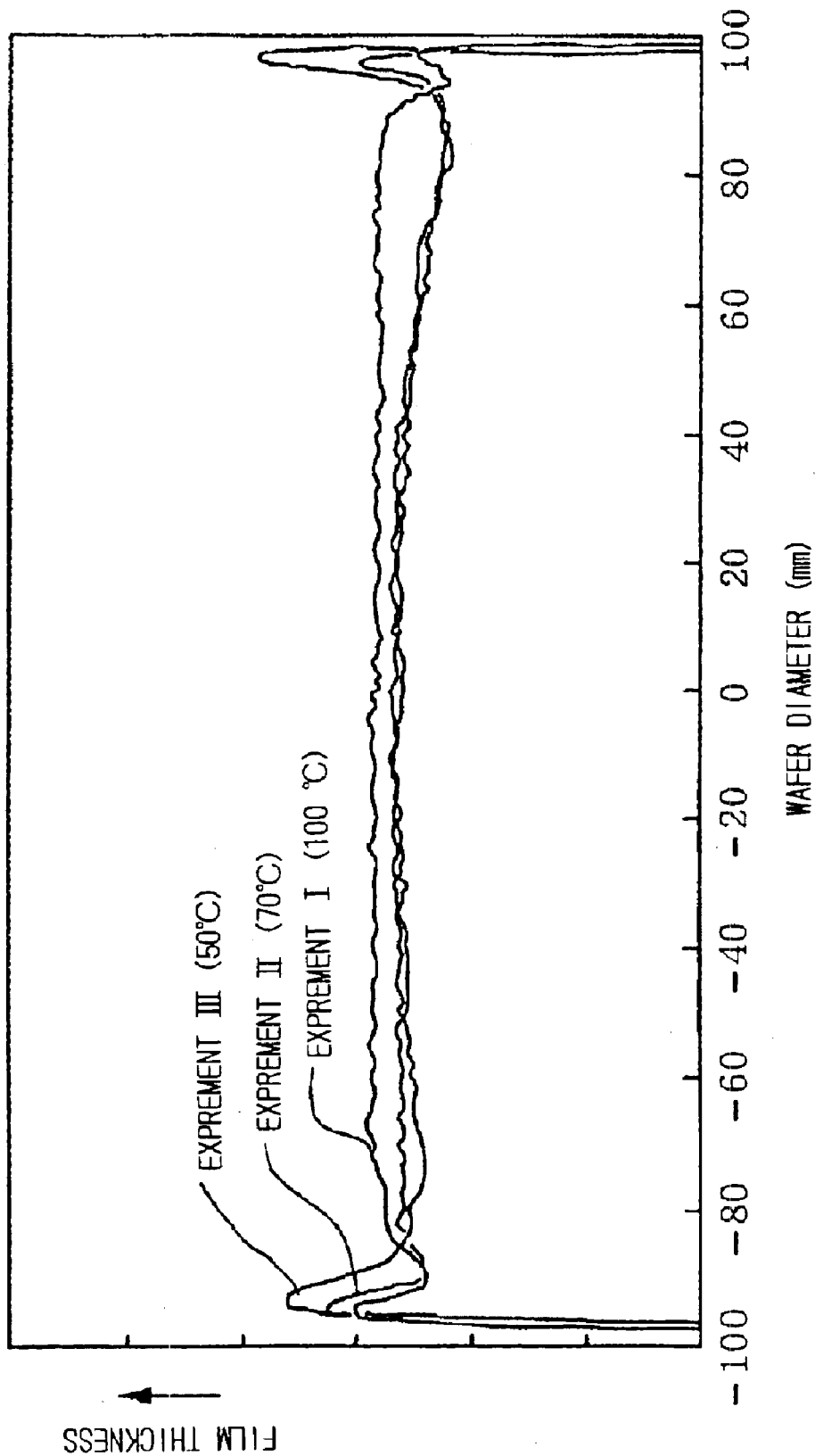
FIG. 28 show characteristic curves indicating further results of the experiments for confirming advantages of the present invention.

Shown in FIG. 28 are the thickness of the coating films formed under the experiments I, II and III. The graphs teach that, the higher the temperature for the first heater 610 of the diffuser plate 600, the smaller the swell of coating film formed on the wafer outer regions. A feasible set temperature for the first heater 610 taught by the graphs is in the range from 70 to 100° C. The temperature may be set higher than 100° C. for the first heater 610, but which could cause decrease in film thickness on the wafer edge regions. Thus, the feasible temperature is 100° C. or lower.

The experiments I, II and III, and also the comparative experiment employed the diffuser plate 600 shown in FIG. 20. It is, however, understood by the skilled in the art that the same advantages will be achieved by using the diffuser plate 6 shown in FIG. 9 with temperature adjustments to the inner first heater 61 at a temperature the same as for the outer first heater 610 of the diffuser plate 600 and the outer second heater 62 at a temperature the same as for the inner second heater 610 of the diffuser plate 600.

As disclosed in detail, a low-pressure dryer according to the present invention is used for drying a substrate applied a coating solution thereon at low pressure. The dyer includes: an airtight chamber installing a substrate table to place the substrate thereon; a diffuser plate, provided as facing the substrate placed on the substrate table with a gap, for discharging gas existing in the gap toward outside, the diffuser plate having a size almost the same as or larger than the substrate; a substrate-temperature adjuster, installed in the substrate table, for adjusting a temperature of the substrate; and a decompression mechanism for decompressing the airtight chamber, wherein the diffuser plate has a temperature adjuster for making temperature adjustments to have a temperature difference between a first region and a second region of the diffuser plate, the first region facing a center region of the substrate, the second region being outside the first region and including a region facing an outer region of the substrate.

The temperature adjuster may make the temperature adjustments so that a temperature of the first region is higher than a temperature of the second region. The temperature adjustments achieve formation of a coating film with minimized temperature difference between the wafer center and outer regions as solvent evaporation advances in a low-pressure drying process. The minimized temperature difference suppresses variation in surface tension over the wafer surface, so that a coating solution formed on the wafer outer regions is not attracted to the wafer center region, thus a coating film of uniform thickness being formed. Thus, the present invention achieves high wafer-surface uniformity in a low-pressure drying process.

Moreover, the temperature adjuster may make the temperature adjustments so that a temperature of the region facing the outer region of the substrate is higher than a temperature of the first region. The temperature adjustments achieve formation of a coating film with suppressing the decrease of temperature on the wafer outer regions which occurs during solvent evaporation in a low-pressure drying process. The suppression of temperature decrease further suppresses increase in surface tension on the wafer outer regions, so that a coating solution formed on the wafer inner region is not attracted to the wafer outer regions, thus a coating film of uniform thickness being formed. Thus, the present invention achieves high wafer-surface uniformity in a low-pressure drying process.

Moreover, another type of low-pressure dryer according to the present invention is used for drying a substrate applied a coating solution thereon at low pressure. The dryer includes: an airtight chamber installing a substrate table to place the substrate thereon; a diffuser plate, provided as facing the substrate placed on the substrate table with a gap, for discharging gas existing in the gap to toward outside, the diffuser plate having a size almost the same as or larger than the substrate; a substrate-temperature adjuster, installed in the substrate table, for adjusting a temperature of the substrate; and a decompression mechanism for decompressing the airtight chamber, wherein the diffuser plate has a concavity facing a center region of the substrate.

According to the present invention, the diffuser plate having the concavity creates an exhaust stream between the substrate and the diffuser plate at low flow rate over the wafer center region while high flow rate over the wafer outer regions during a low-pressure drying process. The difference in flow rate offers uniform discharging of solvent components evaporating from the wafer center and outer regions, thus achieving uniform density for evaporating solvent components over the wafer surface between the wafer and the diffuser plate, and also uniform decrease in temperature due to heat of evaporation over the wafer surface. This results in uniform surface tension over the wafer surface, so that a coating solution formed on the wafer outer regions is not attracted to the wafer inner regions, thus a coating film of uniform thickness being formed. Thus, the present invention achieves high wafer-surface uniformity in a low-pressure drying process.

Moreover, still another type of low-pressure dryer according to the present invention is used for drying a substrate applied a coating solution thereon at low pressure. The dryer includes: an airtight chamber installing a substrate table to place the substrate thereon; a ventilation resistive element, provided as facing the substrate placed on the substrate table with a gap, the ventilation resistive element exhibiting permeability at a first region thereof facing an outer region of the substrate lower than permeability at a second region thereof inside the first region; a diffuser plate, provided as facing the ventilation resistive element with a gap, for discharging gas toward outside, the gas containing evaporating components from the coating solution and passing through the ventilation resistive element to outside; a substrate-temperature adjuster, installed in the substrate table, for adjusting a temperature of the substrate; and a decompression mechanism for decompressing the airtight chamber.

According to this invention, a part of evaporating solvent components that hit the ventilation resistive element returns to the wafer side. In other words, solvent components evaporating from the wafer outer regions are hardly passed through the ventilation resistive element upward. The ventilation resistive element thus suppresses solvent evaporation and minimizes the difference in evaporation over the wafer surface. This results in uniform surface tension over the wafer surface, so that a coating solution formed on the wafer inner region is not attracted to the wafer outer regions, thus a coating film of uniform thickness being formed. Thus, the present invention achieves high wafer-surface uniformity in a low-pressure drying process.

As disclosed above, the present invention achieves high uniformity of surface tension for coating films of uniform thickness over the wafer surface in low-pressure drying procedure.

What is claimed is:

1. A low-pressure dryer for drying a substrate applied a coating solution thereon at low pressure, comprising:

an airtight chamber installing a substrate table to place the substrate thereon;

a ventilation resistive element, provided as facing the substrate placed on the substrate able with a gap, the ventilation resistive element exhibiting permeability at a first region thereof facing an outer region of the substrate lower than permeability at a second region thereof inside the first region;

a diffuser plate, provided as facing the ventilation resistive element with a gap, for discharging gas toward outside, the gas containing evaporating components from the coating solution and passing through the ventilation resistive element to outside;

a substrate-temperature adjuster, installed in the substrate table, for adjusting a temperature of the substrate;

and a decompression mechanism for decompressing the airtight chamber.

2. The low-pressure dryer according to claim 1, wherein the gap between the ventilation resistive element and the substrate placed on the substrate table is in the range from 0.5 mm to 30 mm.

3. The low-pressure dryer according to claim 1, wherein the gap between the ventilation resistive element and the diffuser plate is in the range from 0.5 mm to 10 mm.

4. The low-pressure dryer according to claim 1, wherein the outer region of the substrate has a width of 10 mm±5 mm from an outer edge of the substrate.

5. A low-pressure drying method of drying a substrate applied a coating solution thereon at low pressure, comprising the steps of:

placing the substrate on a substrate table installed in an airtight chamber;

positioning a ventilation resistive element, provided as facing the substrate placed on the substrate table with a gap, the ventilation resistive element exhibiting permeability at a first region thereof facing an outer region of the substrate lower than permeability at a second region thereof inside the first region;

positioning a diffuser plate over the ventilation resistive element as facing the ventilation resistive element with a gap, in relation to the substrate placed under the ventilation resistive element; and decompressing the airtight chamber to allow evaporating solvent components from the outer region of the substrate to pass through the ventilation resistive element and discharge gas existing between the diffuser plate and the ventilation resistive element to outside the diffuser plate, thus evaporating solvent components contained in the coating solution.

* * * * *